United States Patent [19]

Hartmann et al.

[11] Patent Number: 4,774,421

[45] Date of Patent: * Sep. 27, 1988

[54] PROGRAMMABLE LOGIC ARRAY DEVICE USING EPROM TECHNOLOGY

[75] Inventors: Robert F. Hartmann, San Jose; Sau-Ching Wong, Hillsborough; Yiu-Fai Chan, Saratoga; Jung-Hsing Ou, Sunnyvale, all of Calif.

[73] Assignee: Altera Corporation, Santa Clara, Calif.

[*] Notice: The portion of the term of this patent subsequent to Oct. 14, 2003 has been disclaimed.

[21] Appl. No.: 907,075

[22] Filed: Sep. 12, 1986

Related U.S. Application Data

[63] Continuation of Ser. No. 607,018, May 3, 1984, Pat. 4,617,479, and a continuation of Ser. No. 742,089, Jun. 6, 1985, Pat. No. 4,713,792.

[51] Int. Cl.$^4$ ......................................... H03K 19/177
[52] U.S. Cl. .................................. 307/465; 307/468; 364/716; 365/185
[58] Field of Search ............... 307/465, 468, 469, 530, 307/243, 579, 584–585; 340/825.83, 825.91; 364/716, 900 MS File; 365/184–185, 94, 96, 104

[56] References Cited

U.S. PATENT DOCUMENTS

| | | | |
|---|---|---|---|
| 4,177,452 | 12/1979 | Balasubramanian et al. | 307/468 X |
| 4,458,163 | 7/1984 | Wheeler et al. | 364/716 X |
| 4,490,812 | 12/1984 | Guterman | 307/465 X |
| 4,495,427 | 1/1985 | Cartwright, Jr. | 307/469 |
| 4,508,977 | 4/1985 | Page et al. | 364/716 X |
| 4,546,273 | 10/1985 | Osman | 364/716 X |

FOREIGN PATENT DOCUMENTS 0055348 7/1982 European Pat. Off. ............ 364/716
0015533 1/1982 Japan ................................. 364/716

OTHER PUBLICATIONS

"Programmable Array Logic-PAL20RA10", pub. by Monolithic Memories, copyright 1978, pp. 1-15.

Primary Examiner—Stanley D. Miller
Assistant Examiner—D. R. Hudspeth
Attorney, Agent, or Firm—Rosenblum, Parish & Bacigalupi

[57] ABSTRACT

A programmable logic array device basically comprising a programmable AND gate array (FIGS. 5, 11) having addressable rows (40-45) and columns (32-38) or memory cells (30, 31) which can be individually programmed to represent logic data; an input signal receiving circuit (FIG. 9) for developing a corresponding buffered input signal; a first row driver (FIG. 10) responsive to the buffered signal and operative to cause a particular row of memory cells in an AND array (FIG. 11) to output corresponding logical product of AND-input signals, OR/NOR sensing circuitry (FIG. 12) for sensing the AND array product signals and for developing therefrom corresponding logical OR sum signals; circuit means output terminal circuitry; output switching circuitry (FIG. 14) responsive to a control signal and operative to couple either the circuit means output signal or a registered (FIG. 13) output to a device input or output terminal (FIG. 16); feedback switching circuitry similarly responsive to a control signal and operative to couple either the circuit means output signal, registered output signal, or feedback signal to a row driver; and Reprogrammable Architecture control circuitry (FIG. 24) to provide control signals to said switching circuitry. The device has the advantages of increased density of useable logic functions, and decreased power consumption.

27 Claims, 13 Drawing Sheets

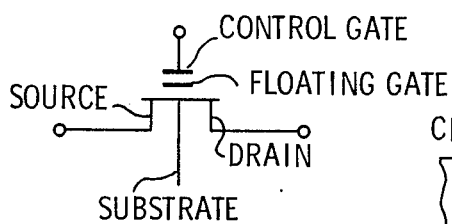
Fig_1
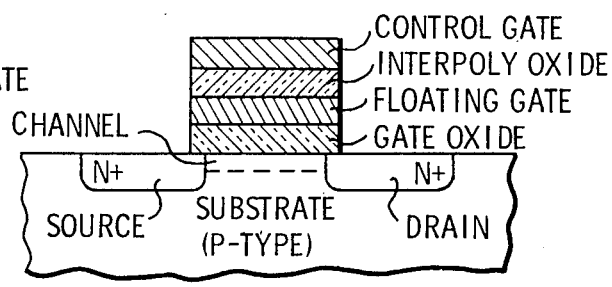
Fig_2
|  | (a) | (b) |
|---|---|---|
| SCHEMATIC DIAGRAM | 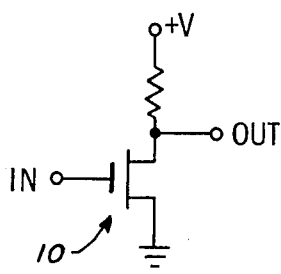 | 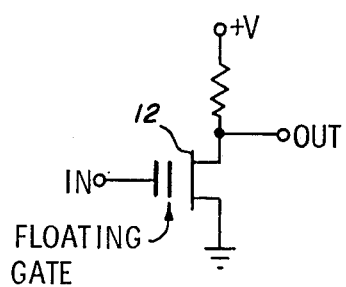 |
| LOGIC DIAGRAM | 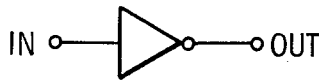 | 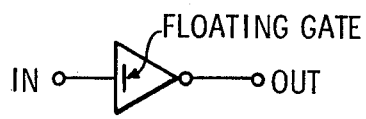 |
| TRUTH TABLE | IN / OUT<br>+V / 0<br>0 / +V | IN / FLOATING GATE / OUT<br>+V / UNPROGRAMMED / 0<br>0 / UNPROGRAMMED / +V<br>X / PROGRAMMED / +V<br>(X MEANS EITHER 0 OR +V) |
Fig_3

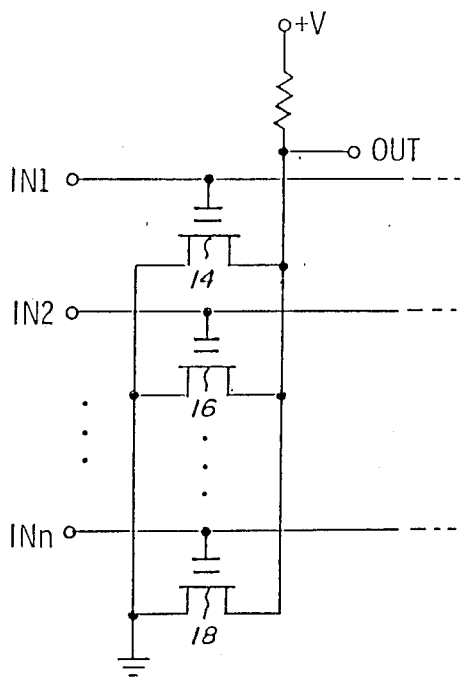
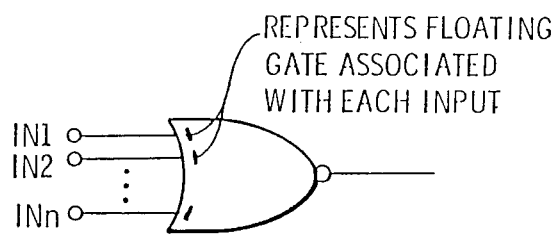
(a) SCHEMATIC DIAGRAM
(b) LOGIC DIAGRAM
| IN1 | IN2 | INn | OUT | |
|-----|-----|-----|-----|---|
| 0 | 0 | 0 | 1 | Note: P in the Truth Table means |
| X | X | 1 | 0 | that the EPROM transistor at that |
| X | 1 | X | 0 | site is programmed. X means |
| 1 | X | X | 0 | either 1 or 0. |
| X(P) | 0 | 0 | 1 | IN1 GATE IS PROGRAMMED |
| X(P) | 1 | X | 0 | |
| X(P) | X | 1 | 0 | |
| 0 | X(P) | 0 | 1 | IN2 GATE IS PROGRAMMED |
| 1 | X(P) | X | 0 | |
| X | X(P) | 1 | 0 | |
| 0 | 0 | X(P) | 1 | INn GATE IS PROGRAMMED |
| 1 | X | X(P) | 0 | |
| X | 1 | X(P) | 0 | |
(c) TRUTH TABLE
Fig. 4

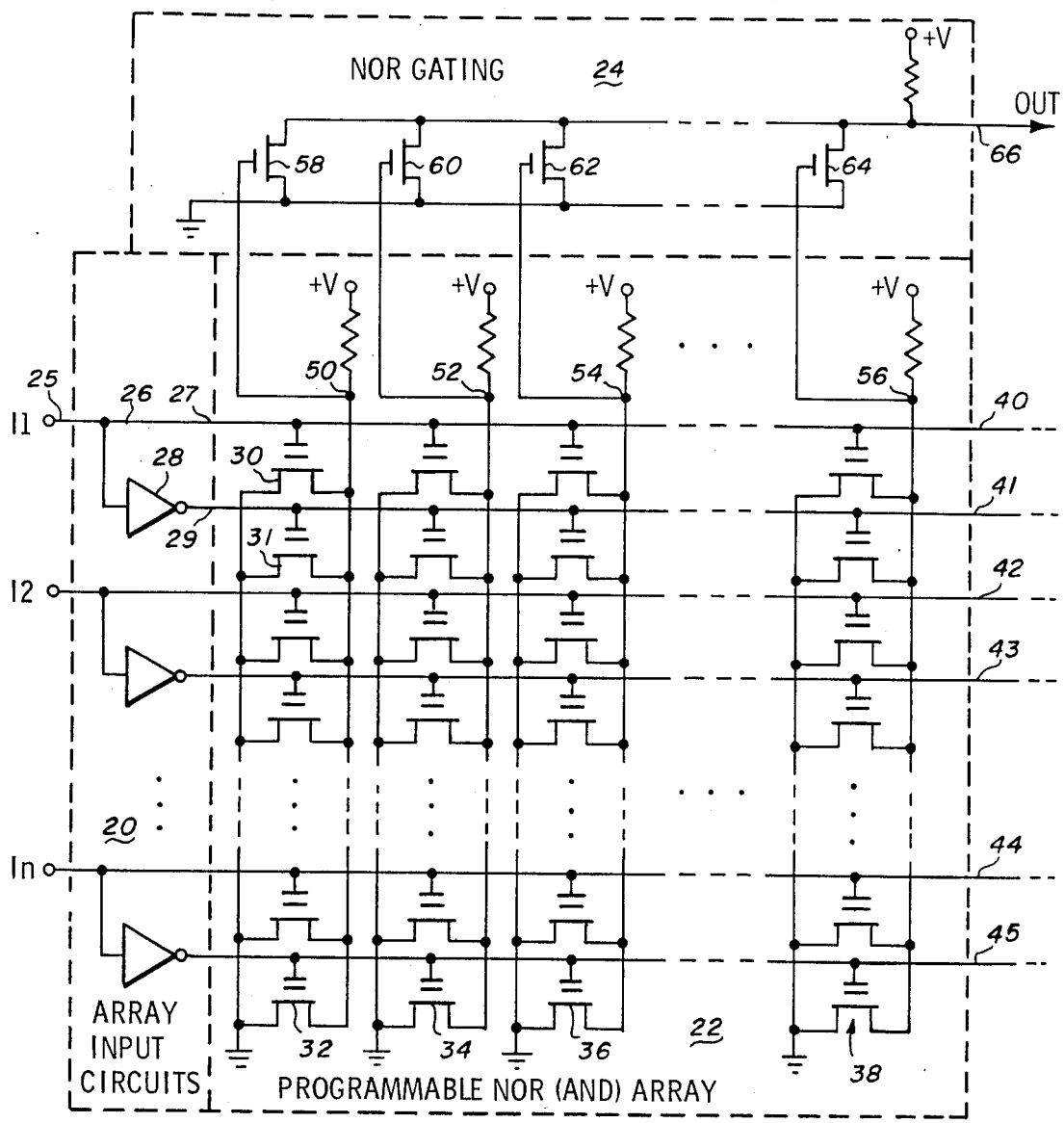
Fig_5
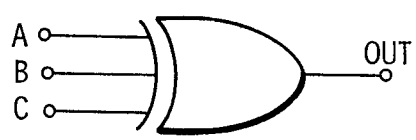
Fig_6
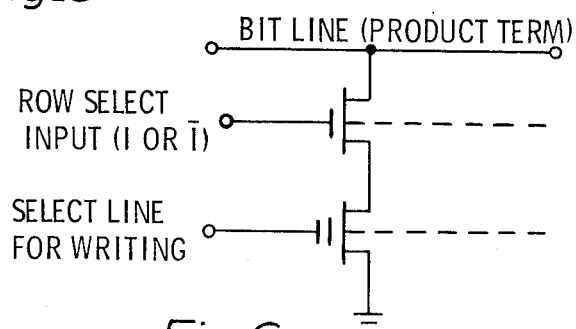
Fig_6a

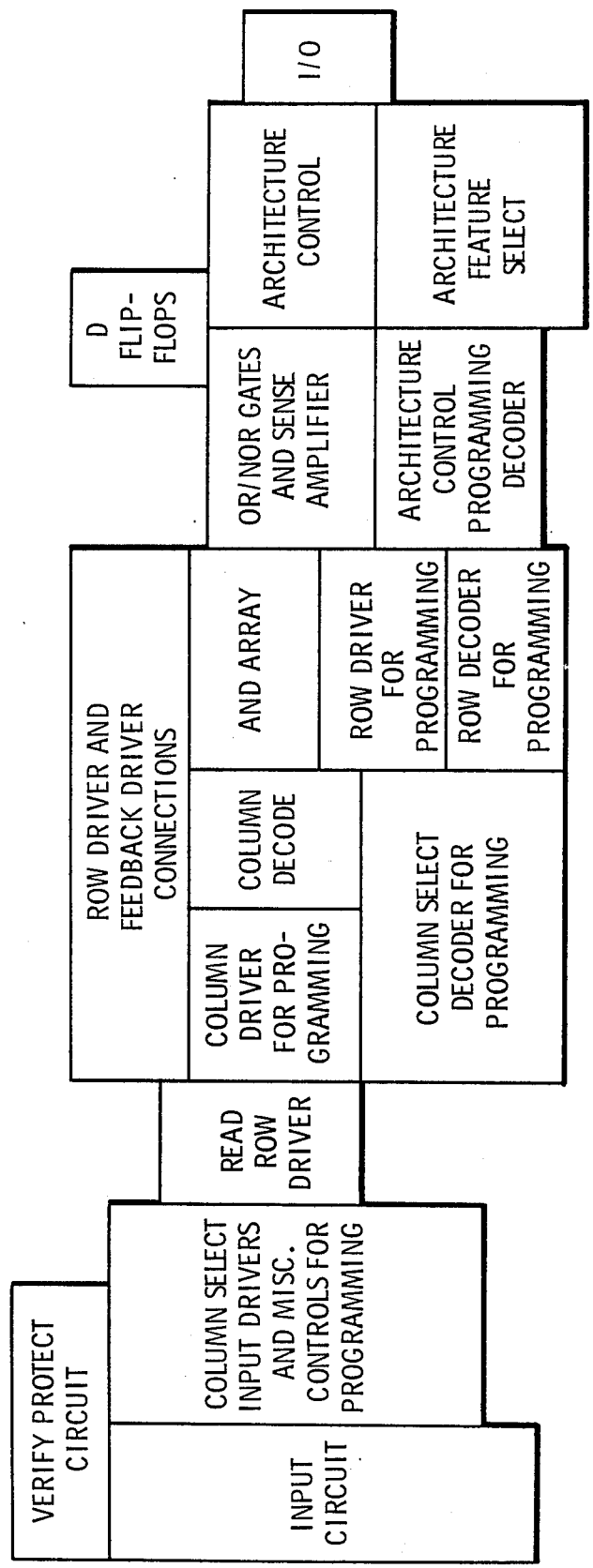
Fig_7

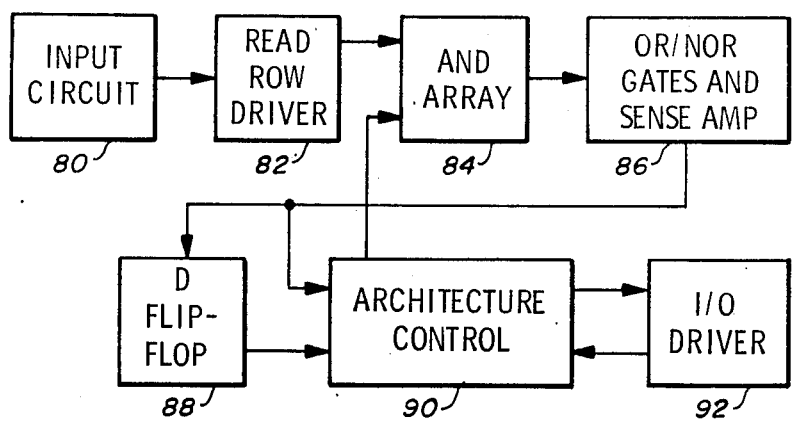
Fig_8A
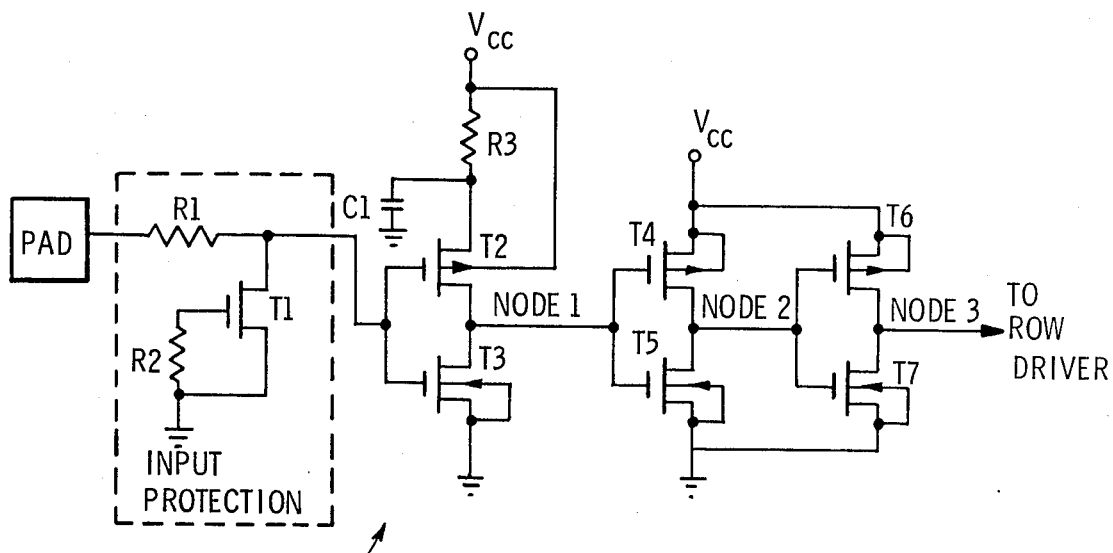
Fig_9

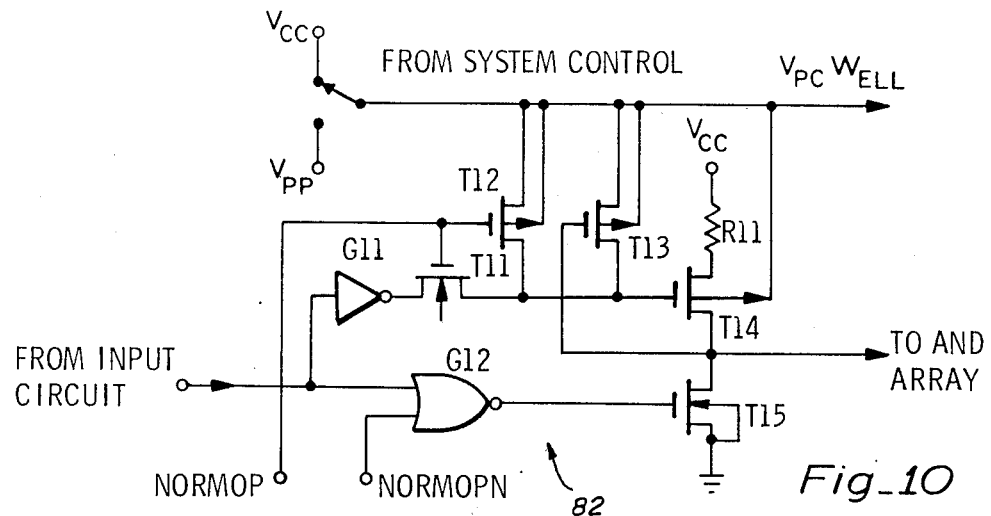
Fig_10
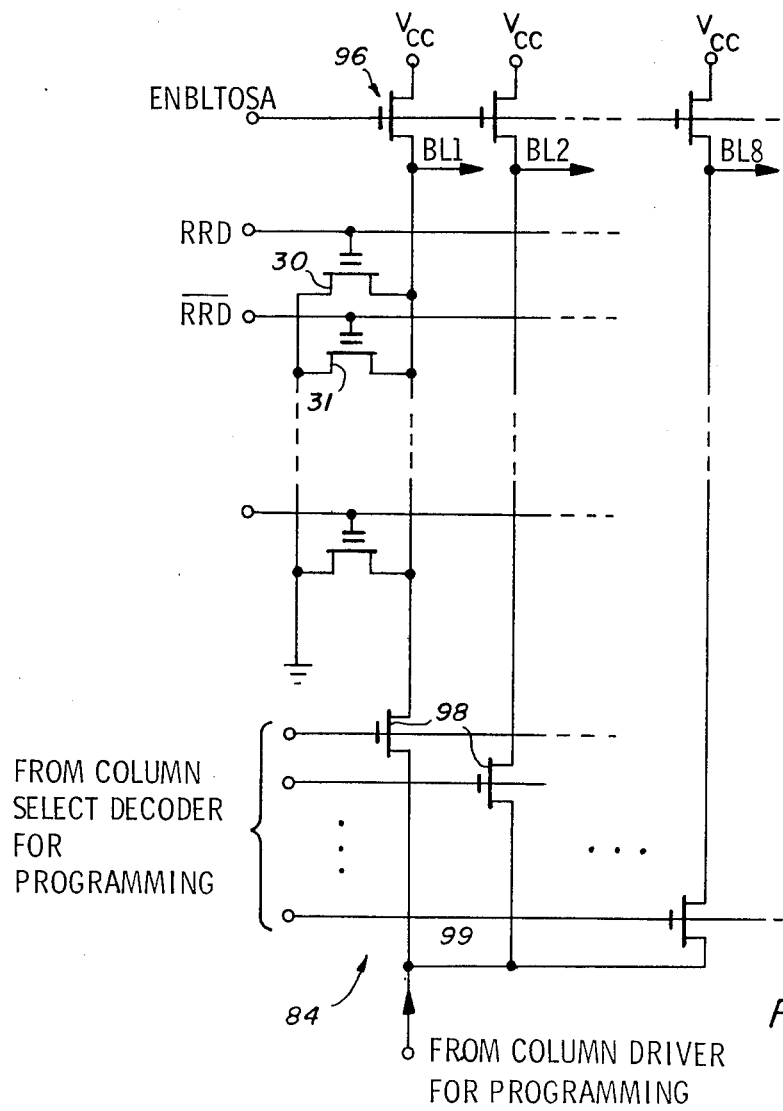
Fig_11

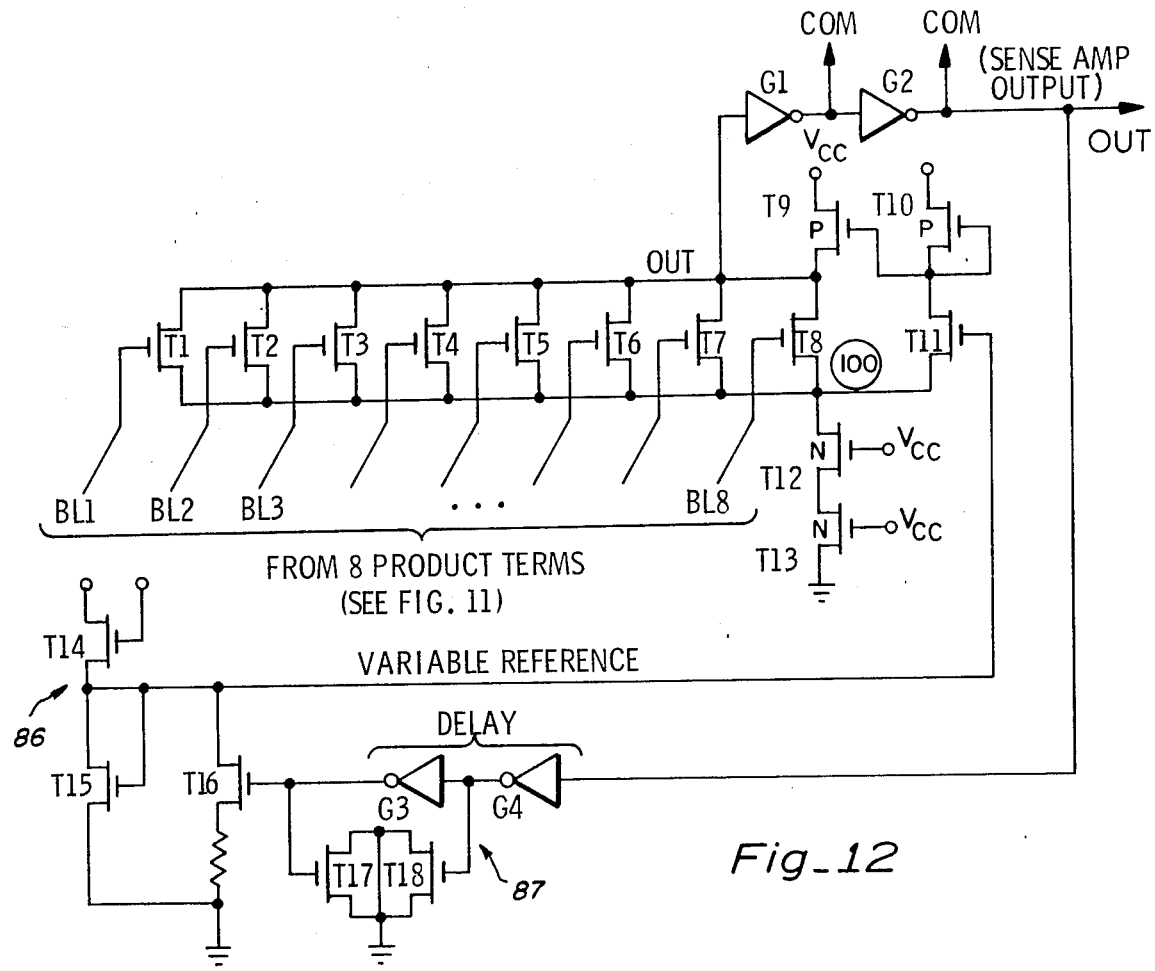
Fig_12
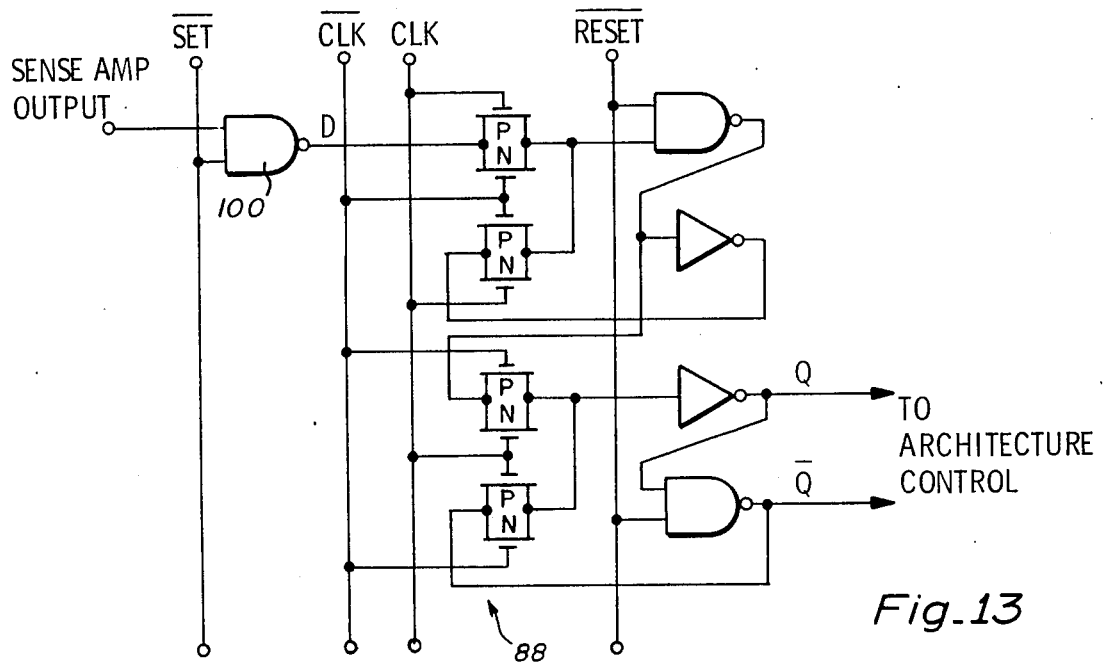
Fig_13

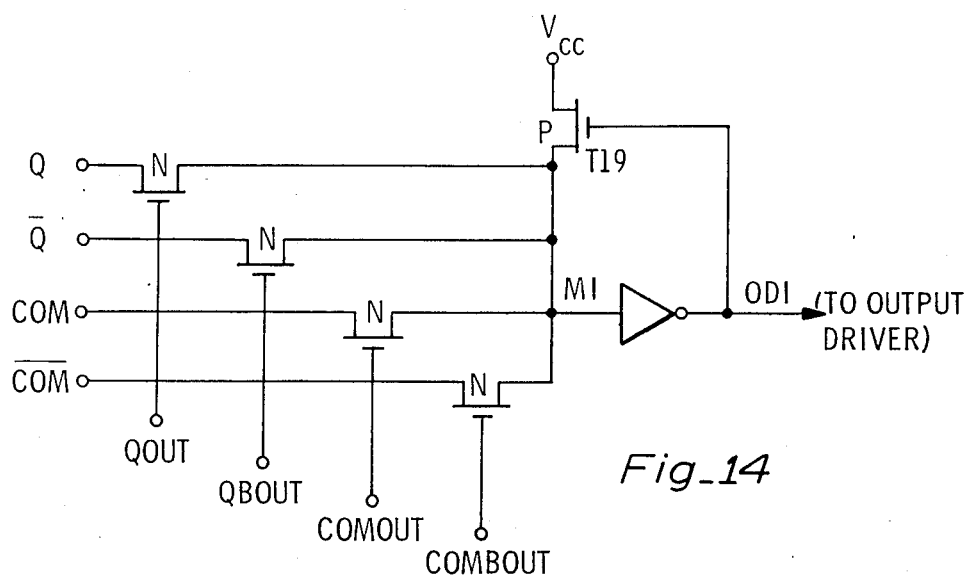
Fig_14
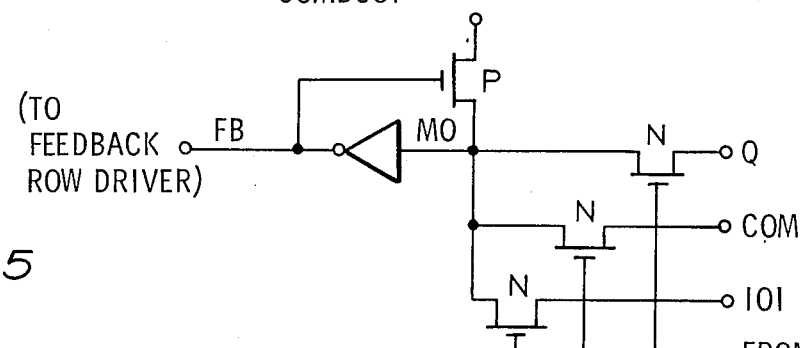
Fig_15
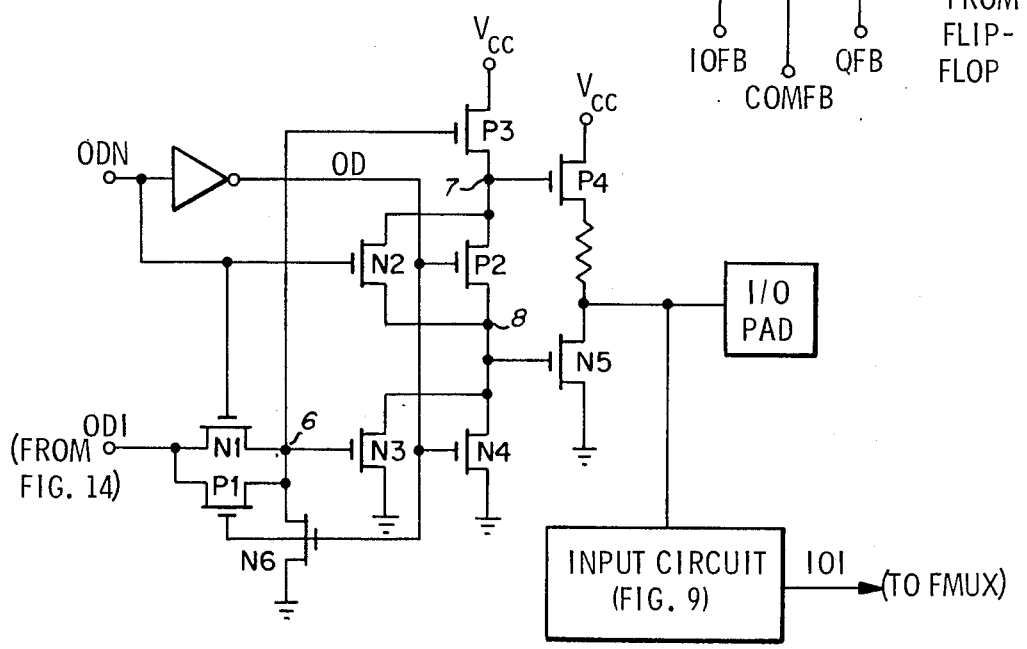
Fig_16

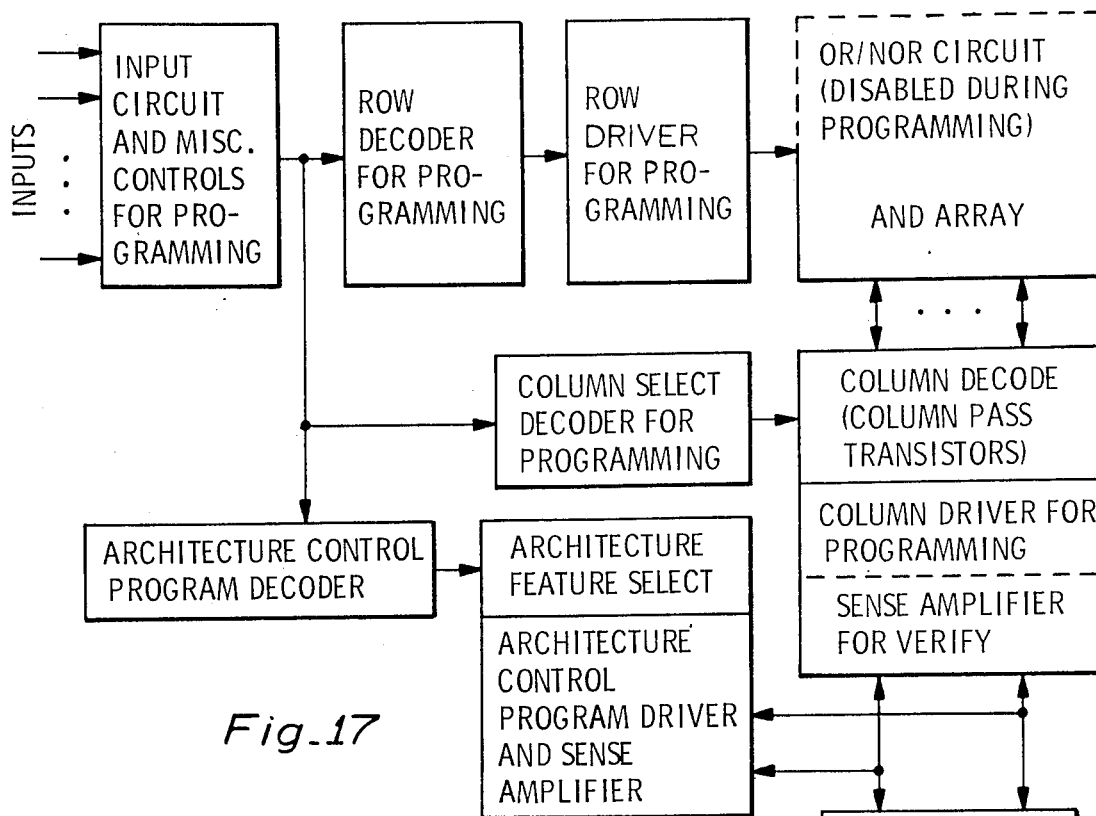
Fig_17
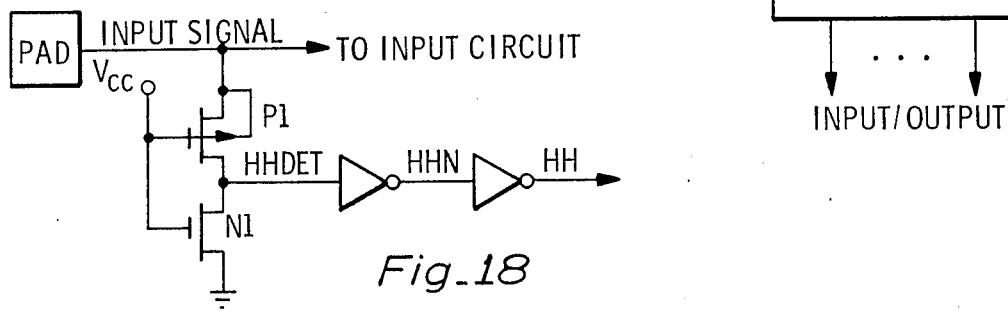
Fig_18
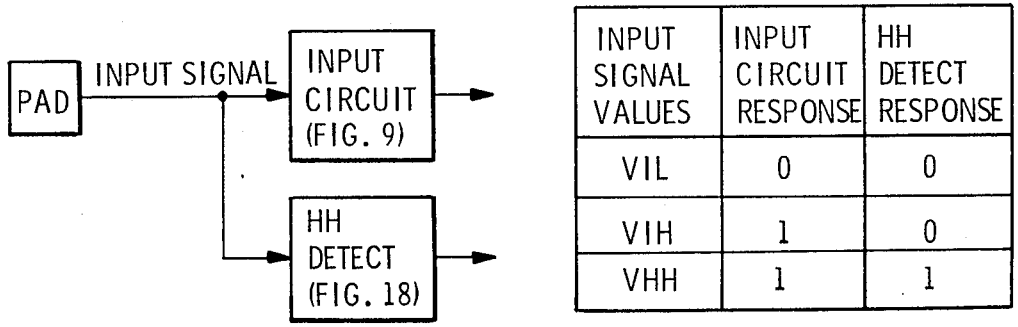
Fig_19

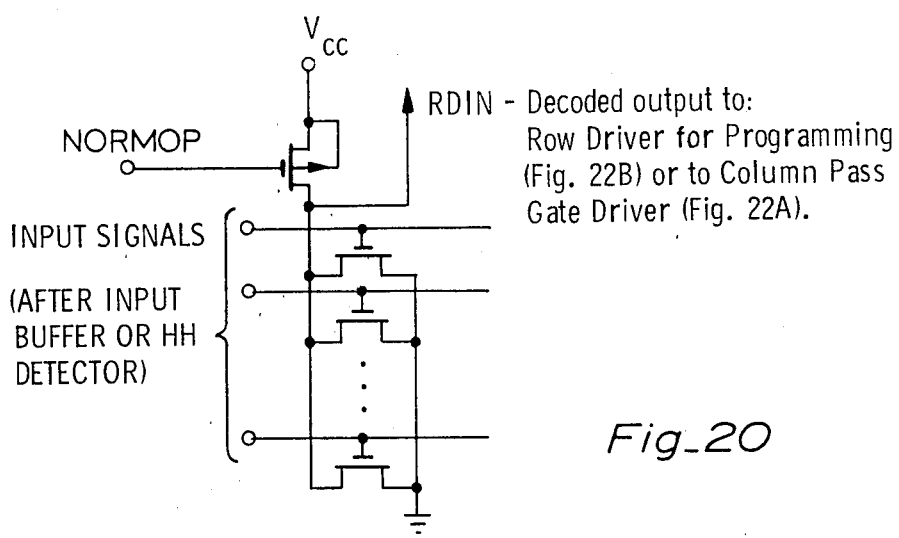
Fig_20
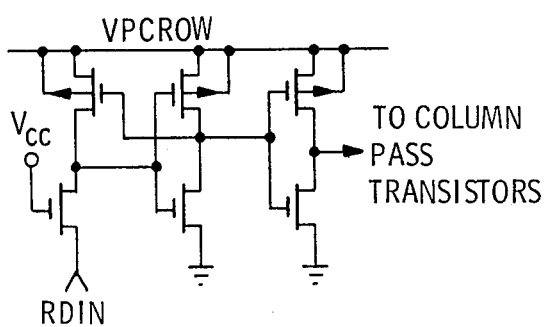
Fig_22A
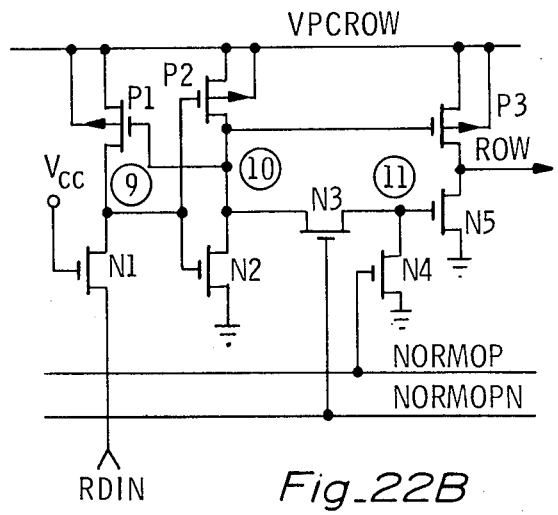
Fig_22B
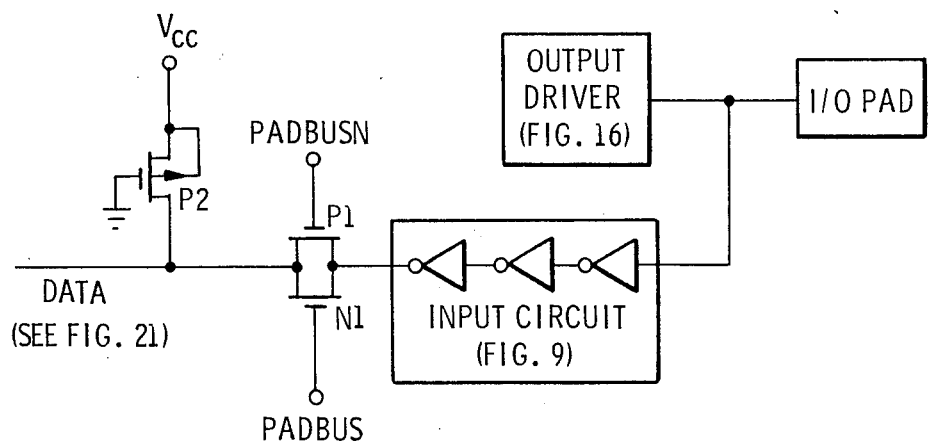
Fig_23

PROGRAMMABLE LOGIC ARRAY DEVICE USING EPROM TECHNOLOGY

This application is a continuation of U.S. patent application Ser. No. 607,018 filed May 3, 1984, and is related to a copending application entitled "Programmable Logic Array Device Using EPROM Technology", now U.S. Pat. No. 4,609,986 issued Sept. 2, 1986, and a copending application, Ser. No. 742,089 filed June 6, 1985 and entitled "A Programmable Macro Cell Using EPROM or EEPROM Transistors for Architecture Control in Programmable Logic Circuits" now U.S. Pat. No. 4,713,792 issued Dec. 15, 1987, both of which are assigned to the assignee of the present invention.

BACKGROUND OF THE INVENTION

1. Field of the Invention

The present invention relates generaly to programmable logic array devices and more particularly to an erasable, electrically programmable logic device made using CMOS EPROM Floating Gate technology.

2. Discussion of the Technology and Prior Art

The integrated circuit technology used in the fabrication of the present invention is CMOS Floating Gate (CMOS EPROM). Floating gate technology allows "programming" of certain transistors such that when normal operating voltages are applied (0 to 5 volts) the "programmed" transistor acts like an open circuit. In their unprogrammed state, these same transistors will conduct when 5 volts is applied to the gate terminal and will appear as an open circuit when 0 volts is applied to the gate terminal.

In the past, the normal application of the technology was to manufacture electrically programmable read only memories (EPROM). The programmable element in EPROM technology is a two layer polysilicon MOS transistor. By changing the circuits which access the array of programmable elements, programmable logic arrays (PLA) can be realized. Prior art U.S. patents include: Kahng, U.S. Pat. No. 3,500,142, Frohman-Bentchkowsky, U.S. Pat. No. 3,660,819; Frohman-Bentchkowsky, U.S. Pat. No. 3,728,695; Frohman-Bentchkowsky, U.S. Pat. No. 3,744,036; Frohman-Bentchkowsky, U.S. Pat. No. 3,755,721; Frohman-Bentchkowsky, U.S. Pat. No. 3,825,946; Simko et al, U.S. Pat. No. 3,984,822; and Lohstroh et al, U.S. Pat. No. 4,019,197.

Programmable logic arrays and similar circuit elements such as programmable array logic (PAL) of the type disclosed in the U.S. Patent to Birkner et al, U.S. Pat. No. 4,124,899 (R) have been in existence for many years. See for example, the U.S. Patents to: Crawford et al, U.S. Pat. No. 3,541,543; Spenser, Jr., U.S. Pat. No. 3,566,153; Proebsting, U.S. Pat. No. 3,702,985; Greer, U.S. Pat. No. 3,816,725; Greer, U.S. Pat. No. 3,818,452; Greer, U.S. Pat. No. 3,849,638. The first realizations were mask programmed. An example is a P channel MOS device manufactured by Texas Instruments during 1968-1970.

More recently, the technology of choice has been fuse programmable bipolar technology made by manufacturers such as Signetics, Monolithic Memories, Inc., Advanced Micro Devices, Harris Semiconductor and others.

The complexity of PLAs and PALs is given in terms of:
(a) The number of Inputs;
(b) The number of Product Terms in the AND array;
(c) The number of Sum Terms in the OR array;
(d) The number of Storage Elements (Flip Flops);
(e) The number of Feedback lines from the output of the OR array (or the Flip Flops) to the AND array; and
(f) The number of Outputs.

SUMMARY OF THE PRESENT INVENTION

The present invention relates to an electrically programmable integrated circuit with a logic complexity of approximately 300 (2-input) NAND gates. The preferred embodiment is designated The Altera EP300 and can generally be classed as a programmable logic array (PLA) with substantial additional circuitry such that many combinations of inputs, outputs and feedback can be accommodated.

The EP300 has the following characteristics:
(a) 10 Inputs (from off chip) to the AND array;
(b) 74 Product Terms (P-Terms);
(c) 8 Sum Terms (Fixed OR Structure with 8 P-Terms each);
(d) 8 D type Flip Flops;
(e) 8 Feedback lines; and
(f) 8 Outputs.

In addition to the above there are several other features of the EP300. These are listed below:
(a) One of the inputs (Pin #1) to the AND array also serves as the CLOCK to the D Flip Flops;
(b) The P-Terms are grouped as follows:
  (1) 8 each to 8 fixed OR/NOR gates (64 P-Terms);
  (2) 1 each to the Output Enable (OE) of each of the eight corresponding output drivers (8 P-Terms);
  (3) 1 P-Term for a asynchromous Reset to the D-Flip Flops;
  (4) 1 P-Term for a synchronous set to the D-Flip Flop;
(c) Each of the Sum Terms from the OR/NOR gate can be either "active high" or "active low";
(d) The I/O pins can output either combinatorial data (active high or active low) or registered data from the D flip flops (active high or active low);
(e) Feedback can be from one of the following three data sources; the I/O pins, the output of the register, the output of the OR gate;
(f) Selection of output data and feedback data is made by programming EPROM transistors in the Architectural Feature Select Section;
(g) EPROM transistors are used for all programmable elements. Thus, the device is electrically programmable and UV light erasable.

The EP300 is intended to be used as a replacement part for standard family logic components such as the 74LSxx series and the more recent 74HC and 74HCT (CMOS) series. As a logic replacement device, a single EP300 will typically replace from 4 to 10 standard family logic components. The reasons for making such substitutions are:
(a) Greater logic density (more logic in less board area); and
(b) Lower system power The ultimate objective of the present invention is to produce a more powerful system for lower overall system cost.

Typical applications for the EP300 are for random logic replacements such as decoders, comparators and multiplexers and for state machines. Logic replacement applications use the combinatorial features of the EP300 while the state machines use the registered feedback features.

These and other features and advantages of the present invention will become apparent to those skilled in the art after having read the following detailed description of the preferred embodiment shown in the several figures of the drawing.

IN THE DRAWING

FIG. 1 is a diagram schematically representing a floating gate field effect transistor;

FIG. 2 is a diagram representationally showing in cross-section a two layer polysilicon field effect transistor;

FIG. 3 is a diagram pictorially comparing the schematic diagrams, logic symbols and truth tables of an MOS N-channel switching device and an MOS EPROM switching device;

FIG. 4 is a diagram illustrating the circuit diagram, logic symbol and truth table of a NOR Gate device made using EPROM switching elements;

FIG. 5 is a schematic diagram showing an implementation of a sum-of-products generator using an array of EPROM NOR gates;

FIG. 6 is a logic symbol representation of an exclusive-or gate;

FIG. 6a is a schematic diagram illustrating an $E^2$ PROM cell;

FIG. 7 is a diagram showing generally the major functional components of the EP300 electrically programmable logic array;

FIG. 8A is a block diagram showing the functional components utilized (for a typical data path) when the EP300 is operated in the Read Mode;

FIG. 9 is a diagram schematically illustrating the Input Circuit of FIGS. 8A and 8B;

FIG. 10 is a diagram schematically illustrating the Read Row Driver of FIGS. 8A and 8B;

FIG. 11 is a diagram schematically illustrating the AND Array of FIGS. 8A and 8B;

FIG. 12 is a diagram schematically illustrating the OR/NOR Gates and Sense Amplifier of FIGS. 8A and 8B;

FIG. 13 is a diagram schematically illustrating the D Flip-Flop of FIGS. 8A and 8B;

FIG. 14 is a diagram schematically illustrating the Output Multiplexer portion of the Architecture Control Circuit of FIG. 8A and the OMUX circuit of FIG. 8B;

FIG. 15 is a diagram schematically illustrating the Feedback Multiplexer portion of the Architecture Control Circuit of FIG. 8A and the FMUX circuit of FIG. 8B;

FIG. 16 is a diagram schematically illustrating the I/O Driver of FIG. 8;

FIG. 17 is a block diagram showing the functional components utilized when the EP300 is operated in the Program Mode and Verify Mode;

FIG. 18 is a diagram schematically illustrating the HH Detect portion of the Input Circuit and Misc. Controls for the Programming circuit of FIG. 17;

FIG. 19 is a diagram schematically illustrating the Three State Detector Portion of the Input Circuit and Misc. Controls for Programming of FIG. 17 and its truth table;

FIG. 20 is a diagram schematically illustrating the ROW and Column NOR Decoder of FIG. 17;

FIG. 22A is a diagram schematically illustrating the Column Pass Gate Driver portion of the Column Select Decoder for Programming of FIG. 17;

FIG. 22B is a diagram schematically illustrating the Row Driver of FIG. 17;

FIG. 23 is a diagram schematically illustrating the Data I/O circuitry of FIG. 17;

DESCRIPTION OF THE INVENTION

Technology Discussion

Figure 8B:
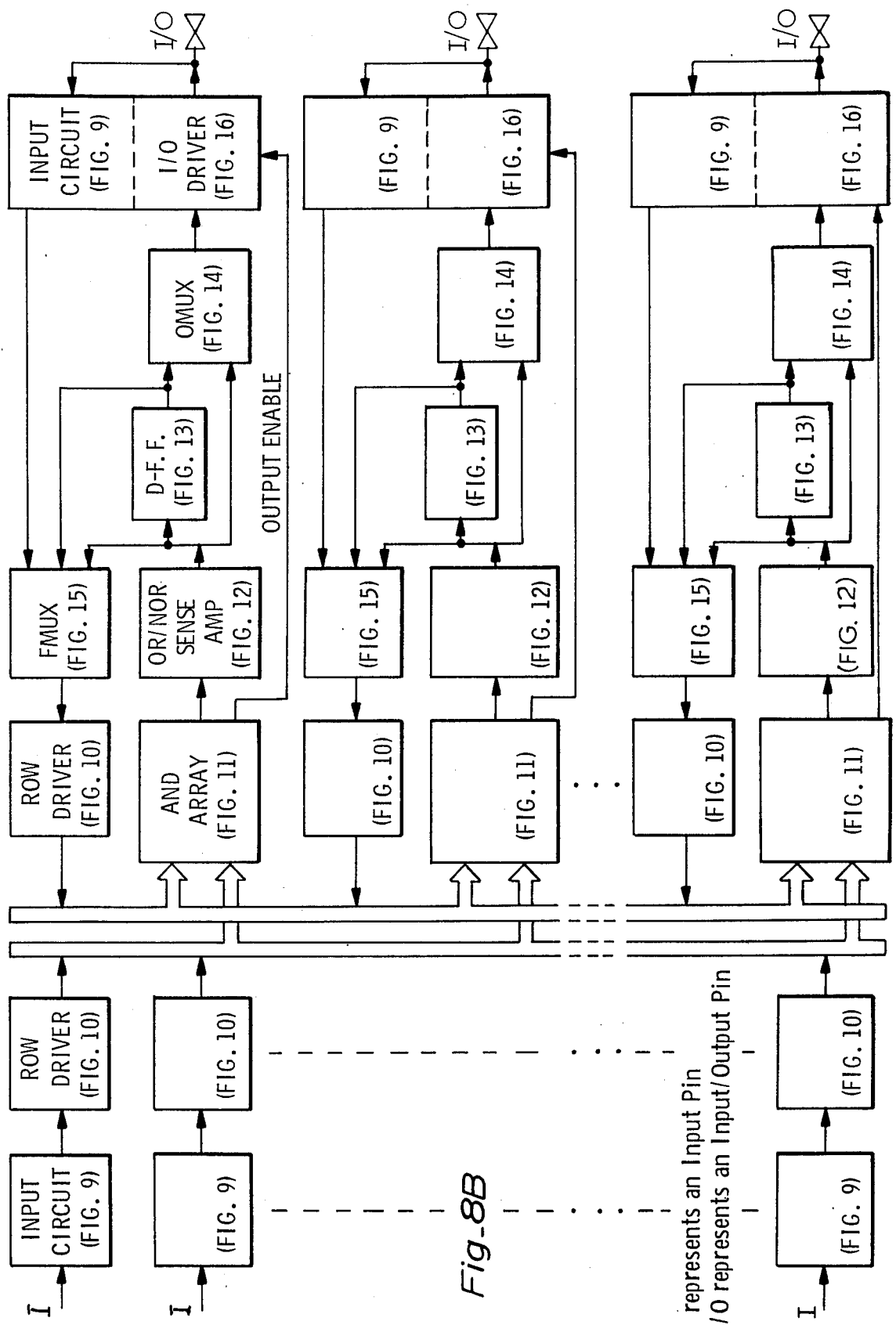
FIG. 8B is a generalized block diagram of the EP300 illustrating the major functional components and their interconnections when operated in the Read Mode.

In order to understand the EP300, it is necessary to understand MOS floating gate technology. The diagrams shown in FIGS. 1 and 2 illustrate a 2 layer polysilicon transistor. An N-channel transistor is representationally shown but the basic mechanism applies to a P-channel transistor as well.

If it is assumed that the floating gate in the structure shown above is initially unprogrammed, then the transistor works as follows. Whenever a positive voltage greater than a certain threshold voltage (VT) is applied to the control gate, a channel is induced under the gate region which allows current to flow between the drain region and the source region. In a typical N channel floating gate device, VT is approximately 1.5 volts. The signals which are applied to the control gate are typically between 0 volts and 5 volts.

The effective threshold of the transistor can be changed by causing charges to be trapped on the floating gate. Electrons are caused to flow to the floating gate when high voltage (typically 21 volts) is applied to the control gate and the drain. When the high voltage is removed, charges remain trapped on the floating gate and cause the effective threshold to be increased to a value greater than the voltage which would be applied to the control gate during Normal Operation. The application of the high voltages and the subsequent charge trapping on the floating gate is called programming.

After the transistor shown above has been programmed, if a 5 volt signal is applied to the control gate, no channel will be created between the source and drain and no current will flow therebetween. This two layer transistor can be thought of as a programmable switch. In the unprogrammed state, the switch opens and closes in response to the application of 0 volts or 5 volts to the control gate. In the programmed state, the switch is always open regardless of whether 0 or 5 volts is applied to the control gate. Under normal environmental conditions, charges will stay trapped on the floating gate for very long periods of time (greater than 10 years). The typical application for this type of structure has heretofore been in the making of EPROMs (electrically programmable read-only-memories).

In the present invention, the EPROM transistor has been applied in a new way making the resultant structure suitable for implementing digital logic. The general structures will be described next.

Logic Structures Using EPROM Transistors

In the diagrams shown in FIG. 3, an inverter is shown in part (a) using a standard N-channel transistor 10 as the switching device and, in part (b) a floating gate transistor 12 is shown as the switching element. Below each schematic diagram, a logic gate representation and the corresponding truth table are shown. The truth table for the EPROM inverter in the unprogrammed state gives the same results as the normal N-channel inverter. However, when the floating gate is programmed, the output is always pulled high, independent of the input. Thus, logic functions can be programmed out of a circuit by programming the floating gate.

In part (a) of FIG. 4 a NOR gate using EPROM elements 14, 16, . . . 18 is illustrated. In this device, the output is only a function of the inputs corresponding to floating gates left unprogrammed. In part (b), the corresponding logic diagram is shown, and in part (c) the truth table for the circuit is set forth.

This circuit is a one dimensional array of EPROM elements which forms a NOR gate, the elements of which are selectively programmable. By extending this concept to a two dimensional array and then collecting the programmable NOR outputs in another set of NOR gates, electrically programmable logic arrays such as illustrated in FIG. 5 can be formed.

There are three major component parts of the circuit shown in FIG. 5: the Array Input circuits 20, the programmable NOR (AND) array 22, and the NOR Gating circuits 24.

The Array Input section consists of a set of subcircuits each including a conductive path 26 formed between an input node 25 and a first output node 27, and a second path including an inverter 28 coupled between node 25 and a second output node 29. Each input to circuit 20 and its complement thus become inputs to the Programmable NOR Array 22.

As illustrated in FIG. 5, the programmable NOR array 22 is comprised of a plurality of gates 30, 31 arranged in a two dimensional array of columns 32–38 and rows 40–45. The control gate electrodes of alternating rows 40, 42, . . . 44 of gates 30 are connected to an output node 27, while the corresponding gate electrodes of alternating rows 41, 43, . . . 45 of complement gates 31 are connected to an inverted output node 29 of the input circuit array 20. The drain regions of the transistors 30, 31 in each column of columns 32–38 are commonly coupled to a corresponding array output node of the nodes 50, 52, 54, . . . 56, and the source regions of the transistors of each column are coupled to circuit ground.

The outputs of the EPROM NOR gates feed into the gate electrodes of another NOR gate array 24 consisting of gates 58–64 which are connected in parallel and produce the desired output at an output node 66. This circuit can generate any logical function of the input variables by generating a so-called "sum-of-products" expression.

The example shown in FIG. 6 will be used to illustrate the case of a 3-input exclusive-or gate. The function of this circuit can be written in logic equation form as:

$$OUT = A \oplus B \oplus C$$

where $\oplus$ is the exclusive-OR operator. This expression can be expanded to the following sum of products $$OUT = A \cdot B \cdot C + \bar{A}BC + \bar{A}B\bar{C} + A\bar{B}\bar{C}$$

The groupings of variables on the right side of the equation are called "product terms" (e.g. A·B·C), and the product terms are "SUMed" together to produce the expression for OUT. By designating certain of the inputs (I1, I2, . . . ) of FIG. 5 as the variables A, B, C of FIG. 6 and by appropriately programming the array 22 of FIG. 5, the desired exclusive-or function of FIG. 6 can be realized. All logic equations can be expressed in this sum-of-products form. (See for example Logic Design Of Digital Systems by Dietmeyer).

The schematic diagram shown in FIG. 5 is an implementation of a sum-of-products generator in which the product generator is an array of EPROM NOR gates (columns) 32, 34, 36 and 38 whose outputs feed another NOR gate 24. In the illustrated example, the "PRODUCT" array 22 is programmable and the "SUM" array 24 is a fixed NOR gate. The fixed NOR gate 24 could alternatively be replaced by an EPROM NOR gate or an EPROM NOR array such that both the SUM array and the PRODUCT array are programmable. This would then be a realization of an EPROM Programmable Logic Array (EPLA) in accordance with the present invention.

Comparison to Other Competing Technologies

Although other programmable elements such as fuse-link and EEPROM devices exist which are suitable for implementing Programmable Arrays, they each have certain disadvantages. In general, the fuse-link elements are less desirable than EPROM elements because:

(1) They take up more silicon area;
(2) They require high current to "blow" the fuse; and
(3) Once programmed, the fuse is physically blown and can not be repaired. These devices are therefor one time programmable.

The EEPROM element has two drawbacks:

(1) It requires more silicon area than does an EPROM; and
(2) The technology is less mature.

However it does have the advantage of being electrically eraseable and reprogrammable, thus allowing for logic functions to be changed in the system in which it is being used. This means that a logic system could modify itself based upon some set of conditions. This also means that real time alterable logic system or "adaptive logic systems" are possible. Furthermore, by replacing EPROM elements with EEPROM cells such as shown in FIG. 6a, an $E^2$ logic array can be realized. In this diagram, N-channel transistors are assumed, but P-channel transistors could also be used with appropriate changes in signal voltages.

General Discussion of the EP300 Logic Diagram

FIG. 7 is an overall diagram showing the major functional components of the EP300 electrically programmable logic array.

The various circuit components will be described within the context of the several Modes of Operation of the EP300. These modes are: Read Mode (also referred to as normal operation), Program Mode, Verify mode, Preload Mode, Test Mode 1, and Test Mode 2.

Read Mode (Normal Operation)

As illustrated in the simplified block diagram of FIG. 8A, the Read Mode circuits consist of the Input Circuit 80, the Read Row Driver 82, the AND Array 84, the OR/NOR Gates and sense amplifier 86, the D Flip-Flop 88, the Architecture Control 90, and the I/O Driver 92.

FIG. 8B is a further illustration of the EP300 showing the major functional blocks and their interconnection when operating in the Read Mode. As depicted, the device consists of a plurality of "macrocells" each including a programmable AND array, an OR/NOR array, a feedback row driver and an I/O driver and input circuit. Each input (designated as I) drives an Input Circuit (FIG. 9) which drives a Row Driver (FIG. 10) which drives all AND Arrays (FIG. 11). ((In the EP300, groups of Product Terms are ORed together by individual OR/NOR Sense Amp circuits (FIG. 12). We will, in this document, interchangably refer to each collection of Product Terms as an AND Array and also refer to all the Product Terms in the EP300 as the AND Array.)) As illustrated in FIG. 8B, all inputs go to all of the AND Arrays. The AND Array drives the OR/NOR Sense Amp (FIG. 12). The output of the OR/NOR Sense Amp is a Sum-of-Products of all signals which feed the AND Array. Each Sum term drives a D Flip-Flop (FIG. 13), a OMUX (FIG. 14) and an FMUX (FIG. 15). The output of the D flip-flop 2120 drives the OMUX and the FMUX. The OMUX drives the Output Driver (FIG. 16) which in turn drives the I/O pin. Each Output Driver is enabled by a Product Term from the AND Array. The FMUX can receive inputs from the OR/NOR Sense Amp or the D Flip-Flop of the Input Circuit connected to the Associated I/O pin. The FMUX drives a ROW driver circuit which in turn drives the AND Array.

Input Circuit—The input circuit 80 accepts a standard TTL level input signal, level shifts the signal and provides an output to the Read Row Driver 82. A simplified schematic of the input circuit 80 is shown in FIG. 9. As shown therein, an input signal comes in through a bonding pad 94 and passes through an input protection circuit consisting of resistors R1 and R2, and a so called "gate-aided-combine breakdown" N-channel transistor T1 which protects the gates of transistors T2 and T3 from static discharges. Transistors T2 and T3, and resistor R3 and capacitor C1 form a level shifter. TTL input levels are defined as VIL=0.8 volts and VIH=2.0 volts. T2 is a P-channel transistor and T3 is an N-channel transistor. The sizes of these transistors are chosen such that when the input is a VIL the voltage at Node 1 will be VCC (+5 volts) and when the input is VIH, Node 1 will be at less than the threshhold voltage of T5. When the input is at 2.0 volts (minimum VIH), both T2 and T3 are conducting. It is desireable to minimize the current flow from VCC thru T2 and T3 during this condition. R3 helps by causing a voltage drop between VCC and the source node of T2. This helps to turn T2 off because the source to gate voltage is reduced by the amount of the IR drop. The addition of resistor R3 increases the speed through the level shifter, reduces power dissipation and allows better sensing of TTL levels. Capacitor C1 is added to speed up the positive transition of Node 1 by helping to hold the source voltage of T2 constant when the input is switched from VIH to VIL. Transistors T4 and T5 form a normal CMOS inverter pair. However T5 is chosen to be larger than T4 to move the switching point lower. Thus as soon as Node 1 gets slightly higher than the turn on voltage VT of T5, Node 2 will go low. Inverter pair T6 and T7 act as a buffer for Node 2 and are capable of driving the Read Row Driver circuit shown in FIG. 10.

Read Row Driver-Referring to FIG. 10, the signal from the Input Circuit drives logic gates G11 and G12 of the Read Row Driver. G11 is a standard CMOS inverter and G12 is a standard CMOS two input NOR gate. Control signals NORMOP and NORMOPN disable the Read Row Driver circuit during Program Mode. The Read Row Driver circuit is active when NORMOP is a logic 1 and NORMOPN is a logic 0. Also VPC Well is at VCC. A logic 1 level from the Input Circuit 80 causes the outputs of G11 and G12 to go low turning T15 OFF and turning T14 ON pulling the output TO AND ARRAY to VCC and turning T13 off. A logic 0 from the Input Circuit 80 causes the output of G11 and G12 to go high turning T15 ON pulling the output toward VSS. At the same time, G11 pulls the gate of T14 high turning it OFF. As the output goes low, T13 is turned ON helping to turn T14 OFF. For each input, both "true" and "complement" signals must drive the AND array 84. Thus, there are two Read Row Drivers per Input. The second driver (not shown) has an extra inverter disposed between the Input Circuit and the Read Row Driver.

AND Matrix—The AND matrix is an array of EPROM NOR gates as discussed above. A single EPROM NOR gate is shown in FIG. 11 to illustrate the actual Pull-up circuit used.

The gate of the N-channel pull-up circuit 96 is driven by the signal ENBLTOSA (Enable Bit Line To Sense Amp). This signal can be turned off during program mode to isolate the bit lines BL1, BL2, ... BLn from VCC. Each bit line BLn is also connected through a column select transistor 98 to the column driver. These column select transistors are turned OFF during Normal Operation. The gates of the EPROM transistors 30 and 31 are driven by signals RRD and $\overline{RRD}$ which are representative of the true and complement signals from a Read Row Driver. In the EP300 there are 18 signal pairs; 10 from input signals and eight from feedback signals. Thus, each bit line BLn is a 36 input EPROM NOR gate. The bit line can also be thought of as a 36 input AND gate $$(\overline{A} + \overline{B} + \overline{C} \ldots = A \, B \, C \ldots)$$

The collection of bit lines will be referred to as the programmable AND matrix. In the EP300, bit lines are collected together in groups of 9. Eight of the nine bit lines go into the OR/NOR gating circuit 86 (FIG. 12) which will be discussed next, while the 9th bit line goes to control the tri-state of the associated output driver.

OR/NOR Gate, Sense Amplifier—As shown in FIG. 12, a grouping of eight bit lines are ORed together in the NOR Sense Amplifier. Transistors T1 through T13 are a sense amp-NOR gate. T1 through T8 receive their inputs from their respective bit lines. T9 acts as a pull-up. The "trip point" of the NOR gate is set by the threshold voltage of T1 through T8 plus the offset voltage created by current flowing through T12 and T13. This current flow is adjusted by T10 and T11. When the voltage of any of the bit lines exceeds the Variable Reference voltage, the output (OUT) will go low. Inverters G1 and G2 amplify the signal producing Sense Amp Output which goes to the D flip-flop 88 (FIG. 13) and the variable reference circuitry 87. The Sense Amp Output is fed back to the variable reference circuit through inverters G3 and G4. The feedback mechanism is such that if any bit line goes high, the Sense Amp Output will go low. After a slight delay caused by gates G3 and G4 and transistors T17 and T18, the output of G3 will also go low, causing the Variable Reference Signal to increase and in turn raise the trip point of the NOR gate Sense Amp. Thus, the trip point is adjusted according to the present state of the Product Term inputs. Adjusting the reference in this way allows the EP300 to sense a smaller signal swing and hence to operate faster.

D Flip-Flop—As illustrated in FIG. 13, the Sense Amp Output from FIG. 12 is input to a D Flip-Flop 88 after passing through the 2 input NAND gate 100, the other input of which is $\overline{SET}$. The $\overline{SET}$ input comes from a single product term from the AND array 84. Whenever the $\overline{SET}$ line is a logic zero, the D input is forced to a logic 1 independent of the Sense Amp Output. The NAND gate 100 thus provides a synchronous SET to the D Flip-Flop where the SET is a function of any of the inputs to the AND array.

The Flip-Flop circuit is a conventional master-slave configuration using N and P channel pass transistors. As explained above, the Flip-Flop has a synchronous set and also has asynchronous reset. The $\overline{RESET}$ input is also a single term from the AND array. If both $\overline{SET}$ and $\overline{RESET}$ are asserted (low), the reset overrides set causing Q to go low and $\overline{Q}$ to go high. With neither $\overline{SET}$ nor $\overline{RESET}$ asserted, the Sense Amp Output is "captured" by the Flip-Flop 88 on the low to high transition of CLK. The Q and $\overline{Q}$ outputs are then passed to the Architecture Control circuit.

Architecture Control—The Architecture Control circuit consists of two pass-gate multiplexers which are designated the Output Multiplexer (OMUX) and the Feedback Multiplexer (FMUX). As depicted in FIG. 14, the OMUX has four data inputs. These are Q and $\overline{Q}$ from the Flip-Flop 88, and the Sense Amp Output signal and its complement which are designated COM and $\overline{COM}$. (COM stands for combinatorial because it is a direct duplication of the combinatorial logic function produced by the AND array and the OR/NOR gate and Sense Amplifier circuit)

Figure 24:
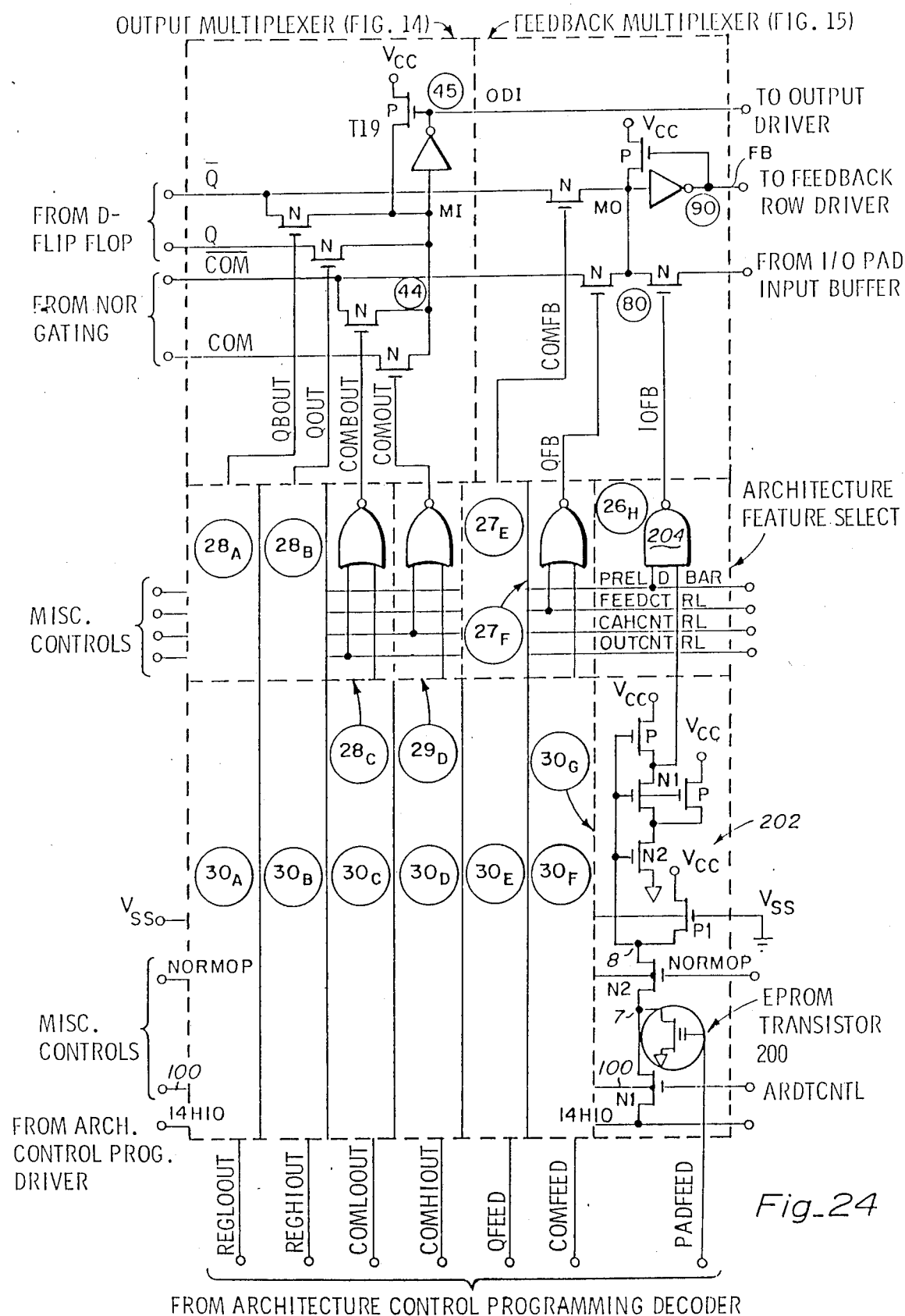
FIG. 24 is a diagram schematically illustrating the Architecture Control Circuit of FIG. 17.

OMUX Circuit—The OMUX controls are QOUT, QBOUT, COMOUT and COMBOUT. The states of the OMUX control signals are determined by a set of EPROM bits which will be described below as part of the Architecture Feature Select Circuitry in FIG. 24. Because pass gates are used, only one OMUX control should ever be asserted (active high) or else a signal conflict at MI could exist. For example, if both QOUT and QBOUT are asserted, the Q and $\overline{Q}$ data inputs will be in conflict and the logic level at node MI will be indeterminate.

The OMUX allows the EP300 outputs to be configured as "registered" or "combinatorial" and be either active high or active low. The data which is passed to node MI is amplified by the inverter whose output (labeled ODI) becomes the input to the Output Driver. The ODI signal also feeds back to drive the gate of a P-channel transistor T19 whose source is tied to VCC and whose drain is tied to node MI. This transistor pulls node MI to a full VCC level. Without it, MI would be one VT voltage lower than the OMUX control signal (approximately 3.5 volts). This then helps to speed up the MI signal transition (to a logic one) and insure a good logic level at the inverter.

FMUX Circuit—The FMUX shown in FIG. 15 is of similar construction to the OMUX. It is a 3 input pass gate multiplexer. The data inputs are Q (from the Q output of the D Flip-Flop 88), COM (combinatorial data from the AND-OR arrays), and IOI (from the IO pad input). The corresponding controls are QFB, COMFB and IOFB. As with the OMUX, the states of these controls are determined by EPROM bits in the Architecture Feature Select block. There is an OMUX and an FMUX associated with each of the AND-OR blocks of the EP300.

I/O Driver—The signal ODI from the Output Multiplexer becomes the input to the Output Driver as shown in FIG. 16. ODN is the (active low) output disable signal which comes from a single product term from the AND Array (FIG. 11). The output circuit works as follows: The Output Driver is active whenever ODN is high. Both the N and the P channel transistors (N2, P2) between node 7 and node 8 are conducting as are the N and P channel transistors (N1, P1,) between ODI and node 6. Data from the OMUX (ODI) drives transistors N3 and P3 which in turn drive the output driver transistors N5 and P4. When ODI is a logic 1, the I/O Pad is driven to VCC through P4 and when ODI is a logic 0, the I/O pad is driven to VSS through N5. If signal ODN is driven low, transistors N1 and P1, and N2 and P2 are turned OFF. Node 8 is driven to VSS through N4, and node 6 is driven to VSS through N6. Node 7 is driven to VCC through P3. Under these conditions, both P4 and N5 are turned OFF. This is the tri-state condition for the output driver.

The I/O pins on the EP300 may be used as either inputs or outputs. When used as inputs, the Output Driver is disabled by means of the ODN signal described above. An input signal applied to the I/O pin goes to an Input Circuit as was shown in FIG. 9. The signal IOI in FIG. 16 is the amplified and level shifted version of the input signal applied to the I/O PAD and is passed to the FMUX.

PROGRAM MODE

Prior to using the EP300 in an application, it is necessary to program the EPROM Transistors in the AND array 84 and in the Architecture Feature Select block 90. FIG. 17 is a block diagram showing the functional components utilized when the EP300 is operated in the Program Mode and Verify Mode. Programming of an EPROM transistor is accomplished by applying high voltage to the gate and the drain. The high electric field from drain to source creates so-called "hot electrons". These hot electrons are attracted to the floating gate because of the high voltage. For 3 micron technology, a gate voltage of 21 volts and a drain voltage of approximately 16 volts will program the floating gate. Electrons with enough energy to jump from the drain to the floating gate remain trapped on the floating gate after the high voltages are removed. The presence of electrons on the floating gate cause the threshold voltage, as seen from the control gate, to be substantially increased such that under normal gate voltages (+5 V) it never will turn ON. Thus, an unprogrammed EPROM transistor will conduct with 5 volts on the gate and will not conduct with 0 volts on the gate, while a programmed EPROM transistor will not conduct in either state.

In order to program a single transistor in the AND array, a row and column selection must be made and appropriate high voltages applied. Some of the read circuitry described above must also be disabled so as to not cause damage. The circuits to be disabled are the Read Row Driver 82 (FIG. 10) and the pull-ups and the AND ARRAY 84 (FIG. 11). The Read Row Driver is disabled by causing NORMOP to go low. The AND ARRAY pull-ups are diabled by causing ENBLTOSA to go low. The Output Drivers must also be tri-stated because the I/O pins will be used as "program data" inputs. After a particular row and column are selected, the program data determines if the selected location is to be programmed or not.

Since all pins are used during normal operation, they must be redefined for programming. The program mode is entered whenever pin 11 is raised to a VHH level. VHH is a voltage greater than 10 volts and may be as high as 21 volts which is the VPP programming voltage. Several pins have VHH detection circuits which invoke various program, verify, and test modes. The following table lists the conditions required to enter various modes.

volts, the output from the second inverter HH is at a logic 1. The table below shows the situation.

| INPUT SIGNAL | HHDET | HHN | HH | |
|---|---|---|---|---|
| VSS = VIL = 0.8 | 0 | 1 | 0 | Normal input |
| 2.0 = VIH = VCC | 0 | 1 | 0 | levels detected. |
| 10.0 = VHH = VPP | 1 | 0 | 1 | HH input levels detected. |

As is illustrated in FIG. 19, input signals (applied to pins which have HH detectors) are connected to a normal Input Buffer (FIG. 9) and an HH detector circuit

EP300 MODE SELECTION

| MODE | PIN 1 | PIN 2 | PIN 3 | PIN 4 | PIN 9 | PIN 11 | PIN 5-8 | PIN 12-19 |
|---|---|---|---|---|---|---|---|---|
| NORMAL OPERATION | NORMAL INPUT LEVELS (Vil-Vih) AS DEFINED BY THE APPLICATION | | | | | | | NORMAL I/O |
| PROGRAM | PROGRAM PULSE | ADDRESS INPUTS (Vil, Vih, Vhh) | | | | VPP | ADDRESS INPUTS (Vil, Vih) | DATA INPUT |
| VERIFY | Vhh | ADDRESS INPUTS (Vil, Vih, Vhh) | | | | X | ADDRESS INPUTS (Vil, Vih) | DATA OUTPUT |
| PRELOAD | CLOCK (Vil, Vih) | NORMAL INPUTS (Vil, Vih) | | | Vhh | | NORMAL INPUTS (Vil, Vih) | DATA INPUT |
| TEST MODE 1 | Vil | Vhh | Vil | X | X | Vpp | X | DATA OUT- |
| TEST MODE 2 | Vil | Vhh | Vih | X | X | Vpp | Row Add- | DATA OUT- |

An EP300 is programmed in a manner similar to an EPROM memory. Taking Pin 11 to a VHH level causes the function of the pins to be redefined such that pins 2 through 9 become addresses which select a matrix row and column, and pins 12 through 19 become data inputs. The states of the data input lines determine whether a location will be programmed or left in its erased state. Eight bits can be programmed at a time.

Eight pins (2 thru 9) are defined as address input pins. If each has only two values (VIL, VIH) then only 256 locations can be selected. Actually, 324 array locations, 7 architectural locations and 1 security bit location must be accessible. In order to extend the address capability of the eight input lines, two pins (4 and 9) have three allowed values (VIL, VIH, VHH). This permits the addressing of all locations.

HH Detect Circuitry

The HH Detect Circuit is shown in FIG. 18. The allowable input values are VIL (VSS≦VIL≦0.8), VIH (2.0≦VIH≦VCC), and VHH (10≦VHH≦VPP). For any input value between VSS and VCC+VTP, the P-channel transistor P1 is not conducting. Since the N-channel transistor is always conducting, the voltage at HHDET is pulled to VSS through N1. (Inverters HHN and HH are simply buffers for node HHDET.) Thus, the signal at HH is zero whenever the input signal is a normal logic level (VIL or VIH).

If the input signal is raised above VCC+VTP, transistor P1 begins to conduct. Current flows from the input pad through P1 and N1 to VSS causing a voltage drop across N1. The transistor sizes are adjusted such that when the input signal is greater than 10 volts, the node HHDET is above the switching threshold of the inverter HHN. Thus, with an input level greater than 10

(FIG. 18). Signals from the Input Buffer can be logically gated with signals from the HH detector to create a third state. The three states are shown in the diagram of FIG. 19.

Row and Column Decoding—Internal Signals from input buffers or HH detectors are passed on to either a row decoder or a column decoder. These decoders are NOR decoders consisting of N-channel pull-down transistors with P-channel pull-ups to VCC. Except for the Architectural Decoder, these P-channel pull-ups are gated by a signal called NORMOP. By doing this, the NOR decoders only dissipate power during programming. A typical NOR Decoder is shown in FIG. 20.

Figure 21:
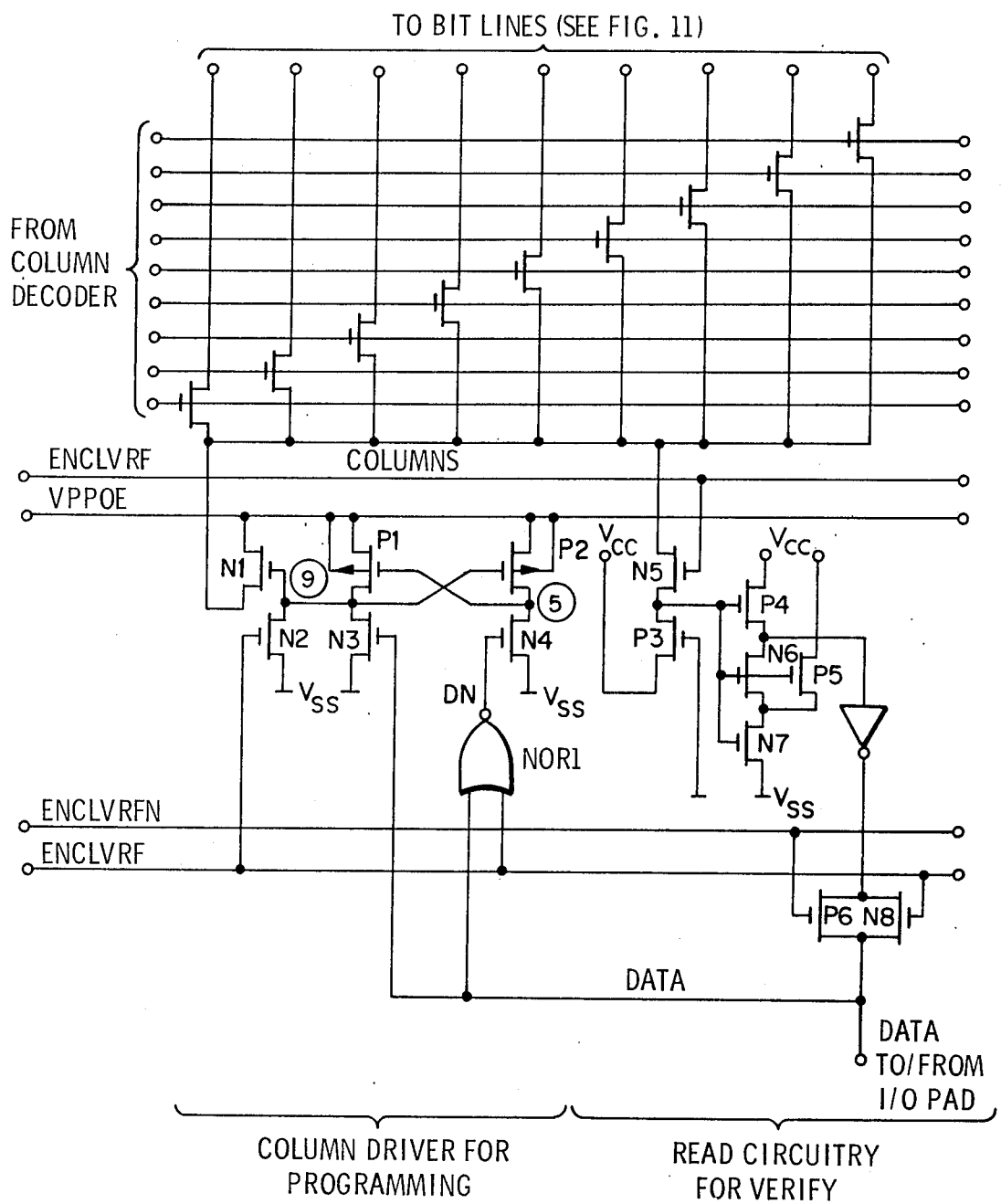
FIG. 21 is a diagram schematically illustrating the Column Driver, Read Circuitry and Column Pass Transistors of FIG. 17.

Column Driver—Outputs from the Column Decoder drive the Column Pass Gate Driver (FIG. 22A) which, in turn drives the gates of the Column Pass Transistors 98 shown in FIG. 11. Referring to FIG. 11, one can see that one side of the Column Pass Transistor is tied to a bit line while the other side is joined in common with other Column Pass Transistors. The common node 99 is driven by the Column Driver for programming. FIG. 21 shows a group of Column Pass Transistors (typically 9) being drive by one Column Driver.

The Column Driver works as follows. When the Programming Mode is invoked, VPPOE (FIG. 21) (which comes directly from Pin 11) is at a VPP level (21 volts). ENCLVRF is at a logic 0 and ENCLVRFN is at a logic 1. NOR1 then reacts only to DATA. Assume DATA is at a logic 1, then DN is zero. This turns OFF transistor N4 and turns ON transistor N3 which pulls node 9 low which in turn pulls node 5 high. This causes transistor P1 to turn OFF and P2 to turn ON. With node 9 low, transistor N1 is OFF thus blocking any current flow from VPPOE to the COLUMNS. Thus with DATA at logic 1, the selected EPROM bit (as selected by the Column Pass Transistors and the ROW DRIVER) will stay in the erased state. Next, assume DATA is at a logic 0. Then DN will be 1 causing N4 to turn ON, pulling node 5 low. This in turn causes P1 to turn ON pulling node 9 high which causes N1 to turn ON and provides a current path fromm VPPOE through the Column Pass Transistor to the selected EPROM bit. Thus, with DATA at logic 0, the selected EPROM bit will be programmed.

In the VERIFY MODE, which will be discussed later, ENCLVRF is at a logic 1 thus overriding DATA by forcing DN and Node 9 to be low which turns transistor N1 OFF. This effectively disables the Column Driver during the VERIFY MODE.

Row Driver—The Row Driver is a tri-stateable driver whose inputs are zero to 5 volt levels from the ROW DECODER and whose outputs are zero to VPP. The ROW DRIVER outputs drive the gate terminals of the EPROM transistors in the AND ARRAY. A schematic diagram of the ROW DRIVER is shown in FIG. 22B.

The Row Driver works as follows: Assume the signal NORMOP is a logic 1 and NORMOPN is logic 0, which is the situation in the READ MODE described above. The signal RDIN from the ROW DECODER is at logic 0 because the decoder pull-up is OFF (see FIG. 19) VPCROW is a local power line which can be switched between VCC and VPP. During the READ MODE, VPCROW is equal to VCC. The signal RDIN is passed through transistor N1 pulling the gates of N2 and P2 low causing node 10 to go high and turning OFF P1 and P3. The pass transistor N3 is turned OFF by NORMOPN, isolating node 10 from node 11. Transistor N4 is turned ON by NORMOP causing node 11 to go low and turning OFF transistor N5. Thus both P3 and N5 are OFF and the output line ROW is left free to be driven by the READ ROW DRIVER described above.

Next, assume NORMOP is at logic 0 and NORMOPN is at logic 1. This is the case during programming. The Row Decoder (FIG. 20) is activated and RDIN can be either logic 0 (decoded) or logic 1 (not decoded). Transistor N3 is turned ON and N4 is turned OFF, thus, connecting node 10 to node 11. VPCROW is switched to the VPP level. Now, if RDIN is low, node 10 is pulled high turning P3 OFF and turning N5 ON, thus pulling ROW to Vss. If RDIN is at logic 1, N2 is turned ON pulling node 10 low. This turns P1 ON, thus pulling node 9 to VPP. Pass transistor N1 blocks the VPP level from the ROW DECODER. With node 9 at VPP, P2 is turned OFF and N2 is turned ON, pulling nodes 10 and 11 low. This turns P3 ON and N5 OFF and drives ROW to VPP. Since ROW drives the gates of the EPROM transistors, programming can now take place.

Row and Column decoding and driving is done simultaneously. A particular EPROM transistor is determined by the intersection of a row and a column.

Data Input For Programming—An EPROM transistor is selected at the intersection of the decoded row address and the decoded column. Whether the selected EPROM transistor is actually programmed, or left in its erased state, is determined by the DATA supplied to the Column Driver as explained above. The DATA line is driven by circuitry as shown in FIG. 23. When the PROGRAM MODE is invoked, the output driver is tri-stated. The signal PADBUS is at logic 1 and PADBUSN is at logic 0 causing the pass transistors (P1 and N1 in FIG. 23) to turn ON. The logical sense of DATA is inverted from that presented at the I/O Pad. From the previous discussion, this means that if a logic 0 is presented at the I/O pad, the selected EPROM transistor will remain in the erased state, while a logic 1 presented at the I/O pad will cause the EPROM transistor to be programmed.

The purpose of transistor P2 in FIG. 23 is to insure that DATA will be forced to a logic 1 whenever the pass transistors driven by PADBUS and PADBUSN are turned OFF.

Architecture Feature Programming—The architecture of the EP300 is determined by which paths are selected in the Output and Feedback Multiplexers of FIGS. 14 and 15. These multiplexers are in turn controlled by the Architecture Control Circuits (there is one for each multiplexer control) shown in FIG. 24. The Architecture Control Circuit consists of an EPROM transistor 200 whose state is "read" by a Schimdt trigger circuit 202. The output of the Schmidt trigger feeds a control gate 204 and the output of the control gate drives the particular multiplexer. There are seven control signals (4 output multiplexer controls and 3 feedback multiplexer controls) per output macro cell, requiring 7 Architectural Control Circuits per macro cell. There are eight macrocells thus requiring 56 Architecture control Circuits in the EP300.

The EPROM bits for Architecture Control are programmed as follows. (Refer to FIG. 24). In the Program Mode, NORMOP is at logic 0 turning OFF transistor N2 thus isolating the EPROM bit from FMUX. EPROM transistor 200 is programmed by raising ARDTCNTL at the gate of N1 to VPP. Also, the gate of 200 (PADFEED) is raised to VPP by the Architectural Program Decoder (FIG. 20) and a VPP level shifting circuit similar to the Pass Gate Driver (FIG. 22A). At the same time, line 14H10 is raised to a VPP-VT level by a column driver circuit similar to that shown in FIG. 21.

Referring now again to FIG. 24, to verify that the EPROM bit has been programmed, PADFEED and ARDTCNTL are taken to Vcc levels. The Architecture Control Program Driver is then disabled and a sense amplifier is connected to 14H10. The sense amplifier senses the state of the EPROM bit and passes the information to the associated Output Driver.

During the READ Mode, the following conditions apply. ARDTCNTL is taken to Vss thus disconnecting node 7 from line 14H10. PADFEED and NORMOP are taken to Vcc. The state of the EPROM bit can then be determined as follows: first, assume that the EPROM transistor 200 has been programmed. Transistor P1 will then pull node 7 and node 8 to Vcc. This will cause transistors N1 and N2 to turn ON pulling node 12 to Vss. During READ, PRELDBAR is at a logic 1. Thus, with node 12 at logic 0, IOFB will be at logic 1 which selects the I/O Pad as the signal to be passed through FMUX to the Feedback Row Driver. If the EPROM transistor had been in its erased state, nodes 7 and 8 would have been pulled high. This would force IOFB to a logic 0. Thus, in The Architecture Feature Select, a programmed EPROM bit selects a feature and an unprogrammed bit de-selects a feature. Initially, in the erased state, all features are de-selected.

Referring now again to FIG. 17, which is a block diagram of the EP300 for either the Program or the Verify Mode, and also referring to the EP300 Mode Select Table for the conditions which select the Verify Mode, it will be seen that the Verify Mode provides a means of interrogating the AND matrix and the Architecture Feature Select Matrix to determine which EPROM transistors have been programmed. Verify Mode is invoked by taking a pin 1 to Vhh. All other inputs are then directed through the INPUT CIRCUITS and appropriate control circuits to the ROW DECODER, the COLUMN SELECT DECODER and the ARCHITECTURE CONTROL PROGRAM DECODER. Although not shown in detail, these decoders are of a type well known to those skilled in the art of EPROM technology. Depending upon the state of the inputs, either eight locations in the AND ARRAY or one of the ARCHITECTURE FEATURES associated with each ARCHITECTURE CONTROL block will be directed through the I/O DRIVERS.

Verify is essentially the reverse process from Programming. The location to be interrogated during Verify is determined by the Input Signal exactly as it would be during Programming. The COLUMN DRIVERS and the ARCHITECTURE CONTROL PROGRAM DRIVERS are disabled and corresponding SENSE AMPLIFIERS are enabled. The data which is read by the SENSE AMPLIFIERS is directed to the output pins through the I/O DRIVERS.

TESTMODES

There are 2 special modes on the EP300. The following Table shows the control voltages necessary to enter the modes. Pin 2 at the HH level signifies the special modes. Pin 1 must be at Vil for the modes to operate properly.

| PIN 1 | PIN 2 | PIN 3 | TESTMODE |
| --- | --- | --- | --- |
| Vil | HH | Vil | 1 |
| Vil | HH | Vih | 2 |

(1) Testmode 1:

Testmode 1 is a reliability test to ensure the integrity of the EPROM elements. During this MODE, all EPROM elements except the VERIFY PROTECT EPROM bit will be stressed. Charge gain/charge loss, and oxide integrity problems may be detected when the mode is exercised in relation to TESTMODE 2 and/or VERIFY mode.

In TESTMODE 1, the gates of all EPROM elements will correspond to the voltage supplied on the VPP/OE pin (pin 11). One can stress all the gates from approximately 4 to 21 volts depending on the reliability test requirements. The supplies to drains of the matrix (2664 bits) and those in the architecture control section (56 bits) are all turned OFF. The voltages on the output pads will be either 1 or 0 depending on the programmed states of the matrix EPROM cells and the voltage supplied on pin 11.

(2) Testmode 2:

TESTMODE 2 is used to detect the VTs of programmed bits in the matrix. In the TESTMODE 2 circuit implementation of the EP300, only the highest VT of the 8 bits in a macrocell group may be detected. VTs of OE, SET and RESET bits cannot be read out using TESTMODE 2.

During TESTMODE 2, all the column pass transistors are turned OFF and an individual row of the matrix is selected by the inputs through the row decoder. The row line voltage is the voltage on the VPP/OE pin (pin 11). One of the multiplexers is turned ON to allow the data from the matrix sense amp to be read out.

Assuming all EPROM bits on the row are programmed, and if the gate voltage on the row is less than the programmed VT on the row of 8 cells, the output on the pad will be a logic 1. When the voltage on pin 11 is raised above the highest VT on that row, the output will trip to a logic 0.

The VT of an individual bit can be read out if only one bit per row is programmed. However, to test the VTs of all bits, the programming, TESTMODE 1 stressing or other reliability testing must be repeated 8 times.

Charge gain tests can also be made by monitoring the VT increases after extended high temperature bakes and/or stresses on unprogrammed cells.

Note that the VERIFY mode can also be used to detect more dramatic VT changes (i.e. changes in VT that will cause a complete change in the output logic state in the VERIFY mode).

PRELOAD MODE

The Preload Mode is entered by raising Pin 9 to Vhh. This causes the output driver to be tri-stated and forces the feedback multiplexer to get data from the I/O pad (independent of Architecture Selection). Thus, the normal feedback path (from the D-Flip-Flop in this case) is disabled and Pad Feedback is enabled. The inputs to the AND array are now all directly controlled by Input and I/O pads. The Preload condition is latched on a high-to-low transistion of the Clock (Pin 1). This frees up Pin 9 to be an input to the AND array.

The inputs to the AND Array act essentially like the "present-state" of a state machine. The output from the AND-OR array is the "next-state". When the Clock makes its transistion from low-to-high, the "next-state" is captured by the D Flip-Flop. Simultaneously, the output is enabled allowing the "next-state" to propagate to the Output.

The Preload mode allows the testing of an EP300 configured as a synchronous state machine by allowing external inputs to completely determine the "present-state". This allows fast and complete testing of all state transitions.

Although the present invention has been described in terms of a preferred embodiment, it will be appreciated that other alterations and modifications may be apparent to those skilled in the art. It is therefore intended that the following claims be interpreted as covering all such alterations and modifications as fall within the true spirit and scope of the invention.

What is claimed is:

1. In a programmable logic device including a plurality of electronic logic circuit means each having data input, output, and input/output terminals, and having signal feedback paths to said data input terminals, and being responsive to input data signals received at said data input and input/output terminals and operative to perform particular logic functions and to generate commensurate circuit means output signals, and programmable means for configuring the architecture of said logic device so that each said logic circuit means is operative to perform a particular logic function, an improved programmable means comprising:

a plurality of architecture control circuits each including:

a reprogrammable memory device having an output terminal and having a programming potential input terminal by which said memory device may be programmed to either a first state to generate a logic signal of a first level or programmed to a second state to generate a logic signal of a second level at said memory device output terminal;

programming means responsive to input program data signals and to an address signal corresponding to said reprogrammable memory device and operative to program said memory device by applying a programming potential to said memory device programming potential input terminal;

sense means coupled to said memory device output terminal for sensing the level of a logic signal generated by said programmed memory device and for developing a commensurate control signal; and multiplexer means responsive to said control signal and operative to couple said logic circuit means output terminal either to an input/output terminal or to a signal feedback path thereby causing said logic circuit means to have one of a predetermined set of logic circuit configurations.

2. In a programmable logic device as recited in claim 1 wherein each said reprogrammable memory device is an EPROM transistor.

3. In a programmable logic device as recited in claim 1 wherein each said reprogrammable memory device is an EEPROM transistor.

4. In a programmable logic device as recited in claim 1 wherein said logic circuit means includes register means for temporarily storing said circuit means output signal and for developing a stored output signal and an inverted stored output signal, and inverting means for receiving said output signal and developing an inverted output signal, and wherein said multiplexer means includes a plurality of transistor switching means connected between a plurality of data receiving terminals and a multiplexer output terminal, said data receiving terminals being coupled to receive said circuit means output signal, said inverted output signal, said stored output signal and said inverted stored output signal, each said switching means being coupled to receive a control signal from one of said architecture control circuits whereby one of said switching means may be rendered conductive and the others of said switching means may be rendered nonconductive by appropriately programming the corresponding reprogrammable memory device.

5. In a programmable logic device as recited in claim 4 wherein each said reprogrammable memory device is an EPROM transistor.

6. In a programmable logic device as recited in claim 4 wherein said reprogrammable memory device is an EEPROM transistor.

7. In a programmable logic device as recited in claim 1 wherein said logic circuit means includes register means for temporarily storing said circuit means output signal and for developing a stored output signal, and wherein said multiplexer means includes a plurality of transistor switching means connected between a plurality of data signal receiving terminals and a multiplexer output terminal, said data signal receiving terminals being coupled to receive said circuit means output signal, said stored output signal and an input signal from said input/output terminal, each said switching means being coupled to receive a control signal from one of said architecture control circuits whereby one of said switching means may be rendered conductive and the others of said switching means may be rendered nonconductive by appropriately programming the corresponding reprogrammable memory device.

8. In a programmable logic device as recited in claim 7 wherein said reprogrammable memory device is an EEPROM transistor.

9. In a programmable logic device as recited in claim 7 wherein each said reprogrammable memory device is an EPROM transistor.

10. In a programmable logic device as recited in claim 1 wherein said logic circuit means includes:

register means for temporarily storing said logic circuit output signal and for developing a stored output signal and an inverted stored output signal, and inverting means for receiving said output signal and developing an inverted output signal, and wherein said multiplexer means includes an output multiplexer having a first plurality of transistor switching means connected between a first plurality of data receiving terminals and a first multiplexer output terminal, said first data receiving terminals being coupled to receive said circuit means output signal, said inverted output signal, said stored output signal and said inverted stored output signal, each said switching means of said first plurality being coupled to receive a control signal from one of said architecture control circuits whereby one of said first plurality of switching means may be rendered conductive and the others of said first plurality of switching means may be rendered nonconductive by appropriately programming the corresponding reprogrammable memory devices; and a feedback multiplexer having a second plurality of transistor switching means connected between a second plurality of data receiving terminals and a second multiplexer output terminal, said second data receiving terminals being coupled to receive said circuit means output signal, said stored output signal and an input signal from said input/output terminal, each said transistor switching means of said second plurality being coupled to receive a control signal from one of said architecture control circuits whereby one of said second plurality of switching means may be rendered conductive and the others of said second plurality of switching means may be rendered nonconductive by appropriately programming the corresponding reprogrammable memory devices.

11. In a programmable logic device as recited in claim 10 wherein each said reprogrammable memory device is an EPROM transistor.

12. In a programmable logic device as recited in claim 10 wherein each said reprogrammable memory device is an EEPROM transistor.

13. In an integrated circuit device including electronic logic circuit means having data input, output, and input/output terminals, and signal feedback paths to said data input terminals, and being responsive to at least one architecture control signal and operative to perform a particular electronic function on at least one input data signal received at a data input terminal to generate at least one commensurate circuit means output signal at said circuit means output terminal, and having programmable means for providing said architecture control signal to configure the architecture of said logic device so that said circuit means will perform a particular electronic function, an improved programmable means comprising:

at least one architecture control circuit including:

a reprogrammable memory device having an output terminal and a programming potential input terminal and which may be programmed either to a first state to generate a logic signal of a first level or programmed to a second state to generate a logic signal of a second level at said memory device output terminal;

programming means responsive to input program data signals and to a corresponding address signal and operative to program said memory device to one of said states by applying a programming potential to said memory device programming potential input terminal; and sense means for sensing the level of a logic signal generated at said programmed memory device output terminal and for developing therefrom said architecture control signal for configuring the architecture of said logic device so that said circuit means will perform a particular electronic function.

14. In an integrated circuit device as recited in claim 13 wherein each said reprogrammable memory device is an EPROM transistor.

15. In an integrated circuit device as recited in claim 13 wherein each said reprogrammable memory device is an EEPROM transistor.

16. In an integrated circuit device as recited in claim 13 wherein said electronic logic circuit means includes multiplexer means responsive to said architecture control signals and operative to couple said circuit means output terminal either to an input/output terminal or to a signal feedback path.

17. In an integrated circuit device as recited in claim 16 wherein each said reprogrammable memory device is an EPROM transistor.

18. In an integrated circuit device as recited in claim 16 wherein each said reprogrammable memory device is an EEPROM transistor.

19. In an integrated circuit device as recited in claim 16 wherein said programmable means includes a plurality of architecture control circuits and wherein said electronic logic circuit means further includes register means for temporarily storing said circuit means output terminal signal and for developing a stored output signal, and wherein said multiplexer means includes a plurality of transistor switching means connected between a plurality of data receiving terminals and a multiplexer output terminal, said data receiving terminals being coupled to receive said circuit means output terminal signal, said stored output signal and an input signal from said input/output terminal, each said transistor switching means being coupled to receive a control signal from one of said architecture control circuits whereby one of said switching means may be rendered conductive and the others of said switching means may be rendered nonconductive by appropriately programming the corresponding reprogrammable memory devices.

20. In an integrated circuit device as recited in claim 19 wherein each said reprogrammable memory device is an EPROM transistor.

21. In an integrated circuit device as recited in claim 19 wherein each of said reprogrammable memory device is an EEPROM transistor.

22. In an integrated circuit device as recited in claim 16 wherein said reprogrammable means includes a plurality of architecture control circuits, and wherein said electronic logic circuit means further includes register means for temporarily storing said circuit means output signal and for developing a stored output signal and an inverted stored output signal, and inverting means for receiving said circuit means output signal and developing an inverted output signal, and wherein said multiplexer means includes an output multiplexer having a first plurality of transistor switching means connected between a first plurality of data receiving terminals and a first multiplexer output terminal, said first data receiving terminals being coupled to receive said circuit means output signal, said inverted output signal, said stored output signal and said inverted stored output signal, each of said first plurality of switching means being coupled to receive a control signal from one of said architecture control circuits whereby one of said first plurality of switching means may be rendered conductive and the others of said first plurality of switching means may be rendered non-conductive by appropriately programming the corresponding reprogrammable memory devices; and a feedback multiplexer having a second plurality of transistor switching means connected between a second plurality of data receiving terminals and a second multiplexer output terminal, said second data receiving terminals being coupled to receive said circuit means output signal, said stored output signal and an input signal from said input/output terminal, each said switching means of said second plurality being coupled to receive a control signal from one of said architecture control circuits whereby one of said second plurality of switching means may be rendered conductive and the others of said second plurality of switching means may be rendered non-conductive by appropriately programming the corresponding reprogrammable memory devices.

23. In an integrated circuit device as recited in claim 23 wherein each said reprogrammable memory device is an EPROM transistor.

24. In an integrated circuit device as recited in claim 22 wherein each said reprogrammable memory device is an EEPROM transistor.

25. In an integrated circuit device as recited in claim 16 wherein said programmable means includes a plurality of architecture control circuits, and wherein said electronic logic circuit means further includes register means for temporarily storing said circuit means output signal and for developing a stored output signal, and wherein said multiplexer means includes output multiplexer having a plurality of transistor switching means connected between a plurality of data receiving terminals and a multiplexer output terminal, said data receiving terminals being coupled to receive said circuit means output signal, said stored output signal and an input signal from said input/output terminal, each said switching means being coupled to receive a control signal from one of said architecture control circuits whereby one of said switching means may be rendered conductive and the others of said switching means may be rendered non-conductive by appropriately programming the corresponding reprogrammable memory devices.

26. In an integrated circuit device as recited in claim 25 wherein each said reprogrammable memory device is an EPROM transistor.

27. In an integrated circuit device as recited in claim 25 wherein each said reprogrammable memory device is an EEPROM transistor.

* * * * *